United States Patent
Scott et al.

(10) Patent No.: US 9,391,565 B2
(45) Date of Patent: Jul. 12, 2016

(54) AMPLIFIER PHASE DISTORTION CORRECTION BASED ON AMPLITUDE DISTORTION MEASUREMENT

(71) Applicant: RF Micro Devices (Cayman Islands), Ltd., George Town, Grand Cayman (KY)

(72) Inventors: Baker Scott, San Jose, CA (US); Ying Shi, Sunnyvale, CA (US); George Maxim, Saratoga, CA (US); Malcolm Smith, San Jose, CA (US); Daniel Ho, Palo Alto, CA (US)

(73) Assignee: TriQuint International PTE, Ltd., Singapore (SG)

( * ) Notice: Subject to any disclaimer, the term of this patent is extended or adjusted under 35 U.S.C. 154(b) by 0 days.

(21) Appl. No.: 14/216,376

(22) Filed: Mar. 17, 2014

(65) Prior Publication Data
US 2014/0266432 A1    Sep. 18, 2014

Related U.S. Application Data

(60) Provisional application No. 61/793,583, filed on Mar. 15, 2013, provisional application No. 61/789,508, filed on Mar. 15, 2013, provisional application No. 61/800,772, filed on Mar. 15, 2013, provisional (Continued)

(51) Int. Cl.
*H03F 1/32* (2006.01)
*H03F 1/26* (2006.01)
(Continued)

(52) U.S. Cl.
CPC ............. *H03F 1/3241* (2013.01); *H01F 27/28* (2013.01); *H01F 27/385* (2013.01); *H03F 1/32* (2013.01);
(Continued)

(58) Field of Classification Search
USPC ................. 330/149; 375/296–297; 455/114.3
See application file for complete search history.

(56) References Cited

U.S. PATENT DOCUMENTS

| 5,420,536 A | 5/1995 | Faulkner et al. |
| 5,507,014 A | 4/1996 | Wray et al. |

(Continued)

FOREIGN PATENT DOCUMENTS

| EP | 1184977 A2 | 3/2002 |
| WO | 2005117255 A1 | 12/2005 |

OTHER PUBLICATIONS

Bogya, Robert I., et al., "Linear Radio Frequency Power Amplifier Design Using Nonlinear Feedback Linearization Techniques," presented at the 60th Vehicular Technology Conference, vol. 3, Sep. 26-29, 2004, IEEE, pp. 2259-2263.

(Continued)

*Primary Examiner* — Hieu Nguyen
(74) *Attorney, Agent, or Firm* — Withrow & Terranova, P.L.L.C.

(57) ABSTRACT

This application discloses correction circuitry for correcting a phase distortion in an amplification circuit by measuring an amplitude distortion and controlling a phase shifting component based upon the measured amplitude distortion. In one embodiment, a first amplitude distortion sensor is coupled to a first node of an amplification circuit, and a first phase shifter is coupled to a second node of the amplification circuit. Additionally, a first control circuit is coupled to the first amplitude sensor and to the first phase shifter. The first control circuit is configured to correlate a first amplitude distortion measured by the first amplitude distortion sensor to a first inferred phase distortion, and to generate a first phase correction signal based upon the first inferred phase distortion, and is configured to send the first phase correction signal towards the first phase shifter.

11 Claims, 25 Drawing Sheets

Related U.S. Application Data application No. 61/800,991, filed on Mar. 15, 2013, provisional application No. 61/801,038, filed on Mar. 15, 2013, provisional application No. 61/946,270, filed on Feb. 28, 2014, provisional application No. 61/946,927, filed on Mar. 3, 2014.

(51) Int. Cl.

| | |
|---|---|
| H03F 3/195 | (2006.01) |
| H03F 3/19 | (2006.01) |
| H03F 3/213 | (2006.01) |
| H01F 27/28 | (2006.01) |
| H01F 27/38 | (2006.01) |
| H03H 7/09 | (2006.01) |
| H03H 7/01 | (2006.01) |
| H03F 3/21 | (2006.01) |

(52) U.S. Cl.
CPC .............. *H03F 3/19* (2013.01); *H03F 3/195* (2013.01); *H03F 3/213* (2013.01); *H03H 7/09* (2013.01); *H03H 7/1775* (2013.01); *H03F 3/211* (2013.01)

(56) References Cited

U.S. PATENT DOCUMENTS

| | | | |
|---|---|---|---|
| 5,675,288 | A | 10/1997 | Peyrotte et al. |
| 6,137,354 | A | 10/2000 | Dacus et al. |
| 6,330,289 | B1 | 12/2001 | Keashly et al. |
| 6,707,338 | B2 | 3/2004 | Kenington et al. |
| 6,819,938 | B2 | 11/2004 | Sahota |
| 6,836,517 | B2 | 12/2004 | Nagatani et al. |
| 6,980,774 | B2 | 12/2005 | Shi |
| 7,102,430 | B2 | 9/2006 | Johnson et al. |
| 7,164,313 | B2 | 1/2007 | Capofreddi et al. |
| 7,212,798 | B1 | 5/2007 | Adams et al. |
| 7,250,815 | B2 * | 7/2007 | Taylor et al. ............ 330/107 |
| 7,317,353 | B2 * | 1/2008 | Hayase ............... 330/149 |
| 7,321,264 | B2 | 1/2008 | Kokkeler |
| 7,333,557 | B2 | 2/2008 | Rashev et al. |
| 7,340,229 | B2 | 3/2008 | Nakayama et al. |
| 7,471,739 | B1 | 12/2008 | Wright |
| 7,652,532 | B2 | 1/2010 | Li et al. |
| 7,917,106 | B2 | 3/2011 | Drogi et al. |
| 7,970,360 | B2 | 6/2011 | Pei |
| 8,013,674 | B2 | 9/2011 | Drogi et al. |
| 8,126,409 | B2 | 2/2012 | Osman et al. |
| 8,175,551 | B2 | 5/2012 | Akaiwa |
| 8,344,806 | B1 | 1/2013 | Franck et al. |
| 8,410,846 | B2 | 4/2013 | Zare-Hoseini |
| 8,620,233 | B2 | 12/2013 | Brobston |
| 8,624,678 | B2 | 1/2014 | Scott et al. |
| 8,653,888 | B2 | 2/2014 | Watanabe |
| 8,653,890 | B1 | 2/2014 | Ahmed et al. |
| 8,736,511 | B2 | 5/2014 | Morris, III |
| 8,749,310 | B2 | 6/2014 | Hayes |
| 8,791,769 | B2 | 7/2014 | Leong et al. |
| 8,829,995 | B2 | 9/2014 | Cohen |
| 8,841,983 | B2 | 9/2014 | Newton et al. |
| 9,094,104 | B2 | 7/2015 | Din et al. |
| 9,124,355 | B2 | 9/2015 | Black et al. |
| 9,203,455 | B2 | 12/2015 | Yang et al. |
| 2002/0057139 | A1 | 5/2002 | Matsumura et al. |
| 2002/0186378 | A1 | 12/2002 | Tazartes et al. |
| 2002/0190795 | A1 | 12/2002 | Hoang |
| 2003/0008577 | A1 | 1/2003 | Quigley et al. |
| 2004/0121741 | A1 | 6/2004 | Rashev et al. |
| 2005/0123064 | A1 | 6/2005 | Ben-Ayun et al. |
| 2005/0195063 | A1 | 9/2005 | Mattsson |
| 2005/0237144 | A1 | 10/2005 | Einzinger et al. |
| 2006/0033602 | A1 | 2/2006 | Mattsson |
| 2006/0226943 | A1 | 10/2006 | Marques |
| 2008/0122560 | A1 | 5/2008 | Liu |
| 2009/0309661 | A1 | 12/2009 | Chang et al. |
| 2010/0013562 | A1 | 1/2010 | Stockinger et al. |
| 2011/0163824 | A1 | 7/2011 | Kawano |
| 2011/0241163 | A1 | 10/2011 | Liu et al. |
| 2012/0081192 | A1 | 4/2012 | Hanaoka |
| 2013/0244591 | A1 | 9/2013 | Weissman et al. |
| 2014/0328220 | A1 | 11/2014 | Khlat et al. |
| 2015/0054582 | A1 | 2/2015 | Goss |

OTHER PUBLICATIONS

Brounley, Richard W., "Matching Networks for Power Amplifiers Operating into High VSWR Loads," High Frequency Electronics, May 2004, pp. 58-62.

Charles, C.T., "A Calibrated Phase and Amplitude Control System for a 1.9 GHz Phased-Array Transmitter Element," IEEE Transactions on Circuits and Systems 1: Regular Papers, vol. 56, No. 12, Dec. 2009, pp. 2728-2737.

Chen, Wei, et al., "A Novel VSWR-Protected and Controllable CMOS Class E Power Amplifier for Bluetooth Applications," International Journal of Design, Analysis and Tools for Circuits and Systems, vol. 1, No. 1, Jun. 2011, pp. 22-26.

D'Andrea, Aldo N., et al., "RF Power Amplifier Linearization through Amplitude and Phase Predistortion," IEEE Transactions on Communications, vol. 44, No. 11, Nov. 1996, pp. 1477-1484.

Dawson, J., et al., "Automatic Phase Alignment for a Fully Integrated Cartesian Feedback Power Amplifier System," IEEE Journal of Solid-State Circuits, vol. 38, No. 12, Dec. 2003, pp. 2269-2279.

Dawson, Joel L., "Feedback Linearization of RF Power Amplifiers," Dissertation for Stanford University, Stanford, Calif., Aug. 2003, 191 pages.

Delaunay, Nicolas, et al., "Linearization of a 65nm CMOS Power Amplifier with a Cartesian Feedback for W-CDMA Standard," Joint IEEE North-East Workshop on Circuits and Systems and TAISA Conference, Jun. 28-Jul. 1, 2009, Toulouse, France, 4 pages.

Do, Ji-Hoon, et al., "W-CDMA High Power Amplifier Using Anti-Phase Intermodulation Distortion Linearization Technology," Asia-Pacific Microwave Conference, Dec. 11-14, 2007, Bangkok, Thailand, 4 pages.

Hoppenjans, Eric E., et al., "A Vertically Integrated Tunable UHF Filter," 2010 IEEE MTT-S International Microwave Symposium Digest (MTT), May 23-28, 2010, Anaheim, Calif., pp. 1380-1383.

Hu, Q.Z., et al., "A SiGe Power Amplifier with Power Detector and VSWR Protection for TD-SCDMA Application," Proceedings of the International Conference on Mixed Design of Integrated Circuits and Systems, Jun. 22-24, 2006, Gdynia, Poland, pp. 214-217.

Hur, J., et al., "An Amplitude and Phase Mismatches Calibration Technique for the LINC Transmitter with Unbalanced Phase Control," IEEE Transactions on Vehicular Technology, vol. 60, No. 9, Nov. 2011, pp. 4184-4193.

Idris, D., et al., "Design and Implementation of Self-Calibration for Digital Predistortion of Power Amplifiers," WSEAS Transactions on Circuits and Systems, vol. 7, No. 2, Feb. 2008, pp. 75-84.

Keerti, Arvind, et al., "RF Characterization of SiGe HBT Power Amplifiers under Load Mismatch," IEEE Transactions on Microwave Theory and Techniques, vol. 55, No. 2, Feb. 2007, pp. 207-214.

Kim, Jangheon et al., "Analysis of Adaptive Digital Feedback Linearization Techniques," IEEE Transactions on Circuits and Systems—1: Regular Papers, vol. 57, No. 2, Feb. 2010, pp. 345-354.

Ko, Sangwon, et al., "A Linearized Cascode CMOS Power Amplifier," IEEE Annual Wireless and Microwave Technology Conference, WAMICON '06, Dec. 4-6, 2006, Clearwater Beach, Florida, 4 pages.

Liu, Jenny Yi-Chun, et al., "Millimeter-Wave Self-Healing Power Amplifier with Adaptive Amplitude and Phase Linearization in 65-nm CMOS," IEEE Transactions on Microwave Theory and Techniques, vol. 60, No. 5, May 2012, pp. 1342-1352.

Mu, Xiaofang, et al., "Analysis of Output Power Variation under Mismatched Load in Power Amplifier FEM with Directional Coupler," IEEE MTT-S International Microwave Symposium Digest, Jun. 7-12, 2009, Boston, Mass., pp. 549-552.

Nakayama, Masatoshi, et al., "A Novel Amplitude and Phase Linearizing Technique for Microwave Power Amplifiers," IEEE MTT-S International Microwave Symposium Digest, vol. 3, May 16-20, 1995, Orlando, Fla., pp. 1451-1454.

(56) References Cited

OTHER PUBLICATIONS

Peng, Zhan, et al., "RF Power Amplifier Linearization Method Based on Quadrature Nonlinear Model," 1st International Conference on Information Science and Engineering, Dec. 26-28, 2009, Nanjing, China, pp. 2711-2713.

Rachakonda, Anil, et al., "Log Amps and Directional Couplers Enable VSWR Detection," RF Design Magazine, Jan. 2007, pp. 28-34.

Scuderi, Antonino, et al., "A VSWR-Rugged Silicon Bipolar RF Power Amplifier," Proceedings of the Bipolar/BiCMOS Circuits and Technology Meeting, Oct. 9-11, 2005, pp. 116-119.

So, Jinhyun, et al., "Digital Predistortion Based on Envelope Feedback," IEEE International Conference on Acoustics, Speech and Signal Processing (ICASSP), Mar. 25-30, Kyoto, Japan, pp. 3169-3172.

Woo, Wangmyong, et al., "A New Envelope Predistortion Linearization Architecture for Handset Power Amplifiers," IEEE Radio and Wireless Conference, Sep. 19-22, 2004, pp. 175-178.

Zhang, X., et al., "Gain/Phase Imbalance-Minimization Techniques for LINC Transmitters," IEEE Transactions on Microwave Theory and Techniques, vol. 49, No. 12, Dec. 2001, pp. 2507-2516.

International Search Report and Written Opinion for PCT/US2014/030431, mailed Jun. 20, 2014, 14 pages.

International Preliminary Report on Patentability for PCT/US/2014/030431, mailed Sep. 24, 2015, 10 pages.

Notice of Allowance for U.S. Appl. No. 14/216,794, mailed Nov. 24, 2015, 7 pages.

Final Office Action for U.S. Appl. No. 14/218,953, mailed Jan. 4, 2016, 11 pages.

Non-Final Office Action for U.S. Appl. No. 14/555,053, mailed Dec. 31, 2015, 5 pages.

Non-Final Office Action for U.S. Appl. No. 14/216,794, mailed Jun. 30, 2015, 5 pages.

Non-Final Office Action for U.S. Appl. No. 14/215,815, mailed May 4, 2015, 13 pages.

Non-Final Office Action for U.S. Appl. No. 14/217,199, mailed Jul. 2, 2015, 6 pages.

Non-Final Office Action for U.S. Appl. No. 14/216,560, mailed Jul. 16, 2015, 9 pages.

Non-Final Office Action for U.S. Appl. No. 14/218,953, mailed Jul. 24, 2015, 10 pages.

Notice of Allowance for U.S. Appl. No. 14/215,815, mailed Oct. 1, 2015, 7 pages.

Non-Final Office Action for U.S. Appl. No. 14/215,800, mailed Nov. 20, 2015, 5 pages.

Final Office Action for U.S. Appl. No. 14/217,199, mailed Oct. 19, 2015, 5 pages.

Final Office Action for U.S. Appl. No. 14/215,800, mailed Mar. 11, 2016, 6 pages.

Non-Final Office Action for U.S. Appl. No. 14/217,199, mailed Feb. 4, 2016, 5 pages.

Non-Final Office Action for U.S. Appl. No. 14/216,560, mailed Feb. 2, 2016, 9 pages.

Notice of Allowance for U.S. Appl. No. 14/218,953, mailed May 2, 2016, 5 pages.

Notice of Allowance for U.S. Appl. No. 14/555,053, mailed Apr. 19, 2016, 7 pages.

\* cited by examiner

EXEMPLARY NON-LINEAR ELEMENTS

EXEMPLARY PHASE SHIFTING COMPONENTS

AMPLIFIER PHASE DISTORTION CORRECTION BASED ON AMPLITUDE DISTORTION MEASUREMENT

RELATED APPLICATIONS

The present application claims the benefit of and priority to U.S. Provisional Patent Application No. 61/793,583, filed Mar. 15, 2013; U.S. Provisional Patent Application No. 61/789,508, filed Mar. 15, 2013; U.S. Provisional Patent Application No. 61/800,772, filed Mar. 15, 2013; U.S. Provisional Patent Application No. 61/800,991, filed Mar. 15, 2013; U.S. Provisional Patent Application No. 61/801,038, filed Mar. 15, 2013; U.S. Provisional Patent Application No. 61/946,270, filed Feb. 28, 2014; and U.S. Provisional Patent Application No. 61/946,927, filed Mar. 3, 2014.

The present application is related to concurrently filed U.S. patent application Ser. No. 14/215,815, now U.S. Pat. No. 9,294,045, entitled "GAIN AND PHASE CALIBRATION FOR CLOSED LOOP FEEDBACK LINEARIZED AMPLIFIERS"; U.S. patent application Ser. No. 14/217,199, entitled "POWER AMPLIFIER WITH WIDE DYNAMIC RANGE AM FEEDBACK LINEARIZATION SCHEME"; U.S. patent application Ser. No. 14/216,794, now U.S. Pat. No. 9,294,046, entitled "RF POWER AMPLIFIER WITH PM FEEDBACK LINEARIZATION"; U.S. patent application Ser. No. 14/215,800, entitled "WEAKLY COUPLED BASED HARMONIC REJECTION FILTER FOR FEEDBACK LINEARIZATION POWER AMPLIFIER"; U.S. patent application Ser. No. 14/218,953, entitled "RF POWER AMPLIFIER WITH TOTAL RADIATED POWER STABILIZATION"; and U.S. patent application Ser. No. 14/216,560, entitled "RF REPLICATOR FOR ACCURATE MODULATED AMPLITUDE AND PHASE MEASUREMENT".

All of the applications listed above are hereby incorporated herein by reference in their entireties.

FIELD OF THE DISCLOSURE

The field of the disclosure is correction of phase distortion in a power amplifier circuit. Specifically, phase distortion in a power amplifier is corrected based upon a measurement of amplitude distortion, and not based upon a measurement of phase distortion.

BACKGROUND

Power amplifiers include non-linear components. For example, an equivalent resistance at a node in the signal path of a power amplifier varies as the power of the signal varies. Similarly the equivalent capacitance at a given node varies nonlinearly with power level. Thus, signals amplified by the power amplifier include phase distortion and amplitude distortion.

A classic feedback loop for correcting phase distortion in a power amplifier is complex, expensive, consumes much power, and occupies much space. This classic feedback loop measures the phase of an amplified signal, compares the measured phase to a reference phase to determine a phase error, generates a phase error signal, and modifies an input signal (or modifies the power amplifier) to correct the phase error and generate an undistorted amplified signal.

Thus, in conventional power amplifiers there is no way to correct phase distortions without first measuring the phase distortion of the amplified signal.

SUMMARY

Nonlinear elements in power amplifiers cause undesired amplitude distortions and undesired phase distortions. Phase distortions are relatively difficult to measure. In contrast, amplitudes and amplitude distortions are relatively easy to measure.

Correlations have been predicted (and observed) between amplitude distortions and phase distortions in power amplifiers. Thus, an amplitude distortion may be measured, and the measured amplitude distortion may be used (directly or indirectly) to correct a phase distortion by varying a phase shifting component (a phase shifter) such as a varactor or a variable resistor.

In other words, a phase distortion may be inferred (or estimated based upon a correlation) from an amplitude distortion measurement (without requiring a phase distortion measurement circuit). This inferred phase distortion may be used to correct the phase distortion.

In one embodiment, a first amplitude sensor is coupled to a first node of an amplification circuit, and a first phase shifter is coupled to a second node of the amplification circuit. Additionally, a first control circuit is coupled to the first amplitude sensor and to the first phase shifter. The first control circuit is configured to correlate a first amplitude distortion measured by the first amplitude sensor to a first inferred phase distortion, and to generate a first phase correction signal based upon the first inferred phase distortion, and is configured to send the first phase correction signal towards the first phase shifter.

In one embodiment, a first amplitude sensor is coupled to a first node of an amplification circuit, and a first phase shifter is coupled to a second node of the amplification circuit. The first phase shifter is coupled to the first amplitude sensor. The first amplitude sensor is configured to detect a first saturation. The first phase shifter is configured to shift a first phase upon detection of the first saturation by the first amplitude sensor.

The sensor and the phase shifter (and optionally the control circuit) may be described as a correction circuit for correcting a phase distortion of the amplification circuit. To summarize, the correction circuit corrects a phase distortion of the amplification circuit based upon measuring an amplitude distortion.

Those skilled in the art will appreciate the scope of the present disclosure and realize additional aspects thereof after reading the following detailed description of the preferred embodiments in association with the accompanying drawing figures.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 20:
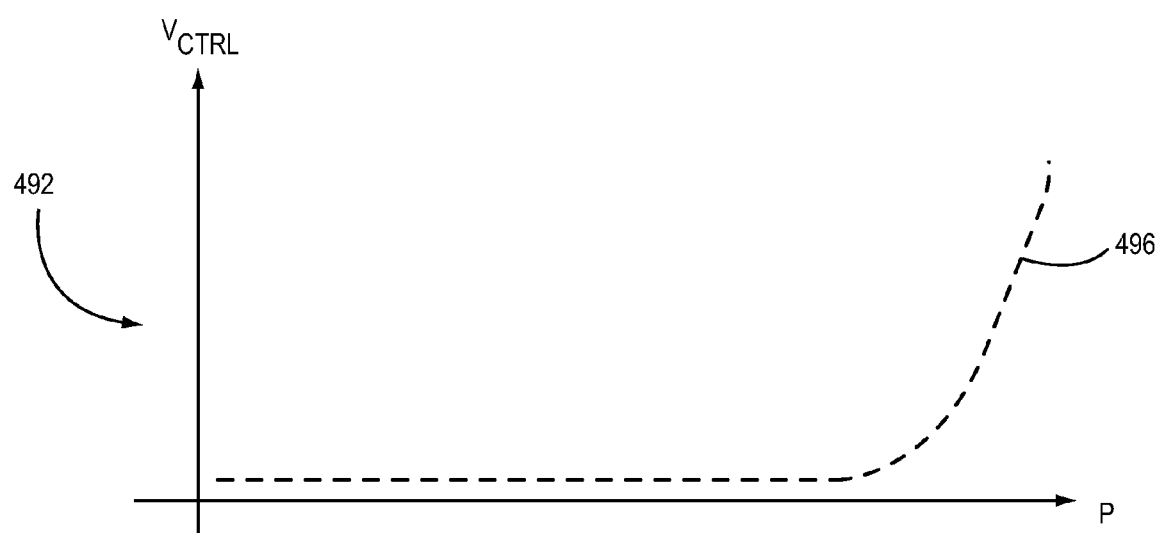

FIG. 20 graphs capacitance as a function of power, and other variables as a function of power.

Figure 21:
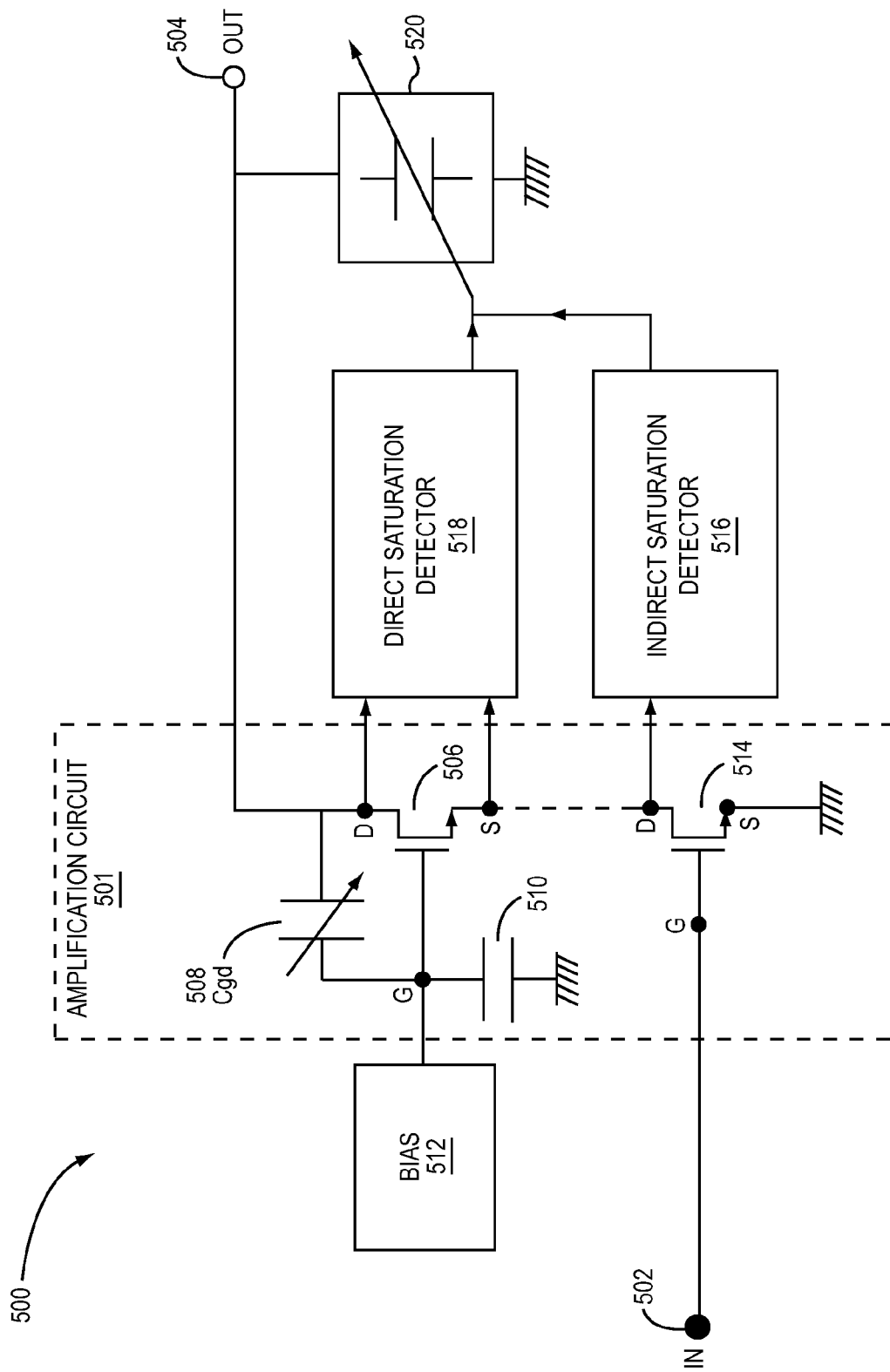

FIG. 21 illustrates a communication circuit including a floating direct saturation detector, an indirect saturation detector, and a phase shifter at the output.

Figure 22:
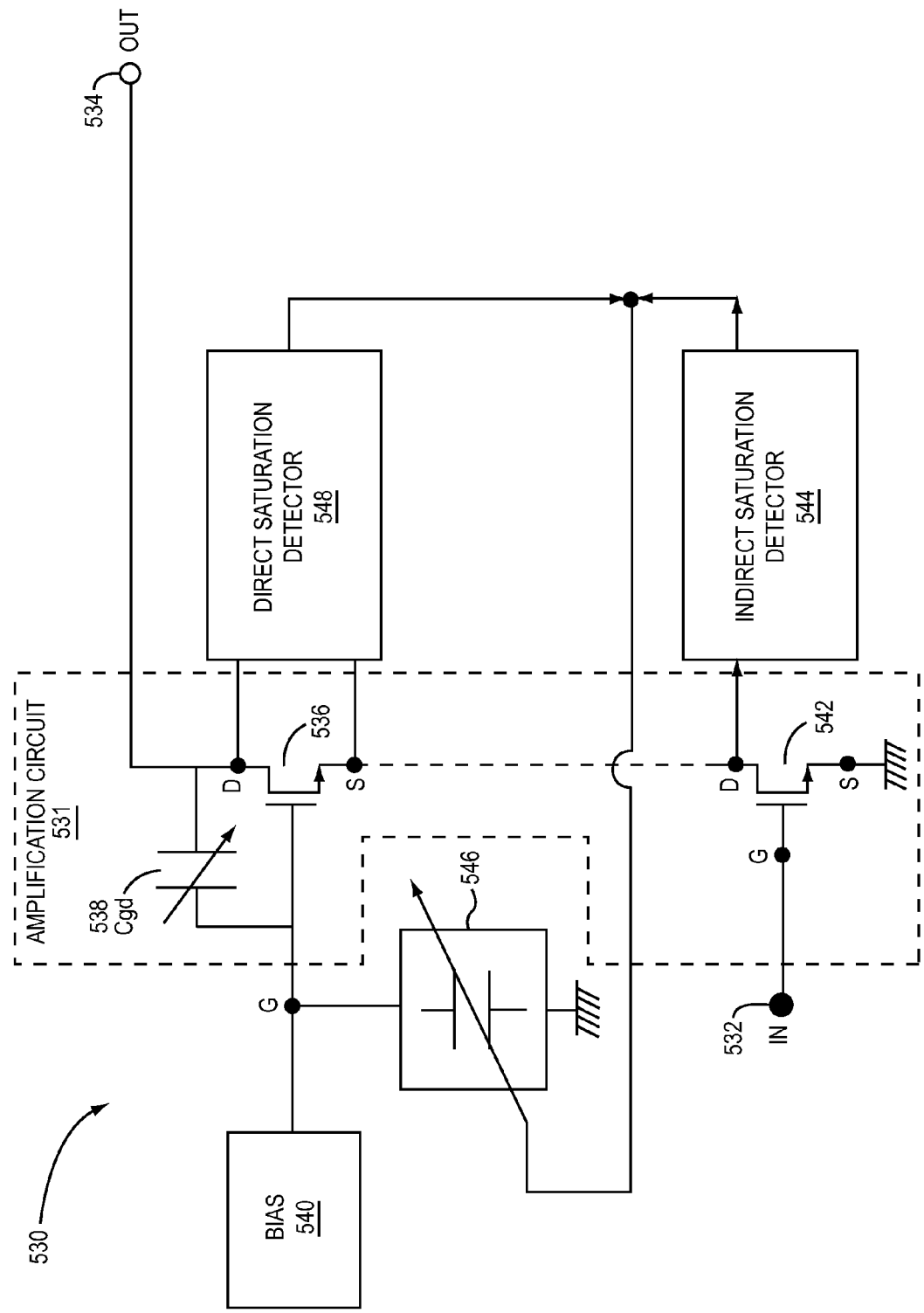

FIG. 22 illustrates a communication circuit including a floating direct saturation detector, an indirect saturation detector, and a phase shifter at a bias circuit.

Figure 23:
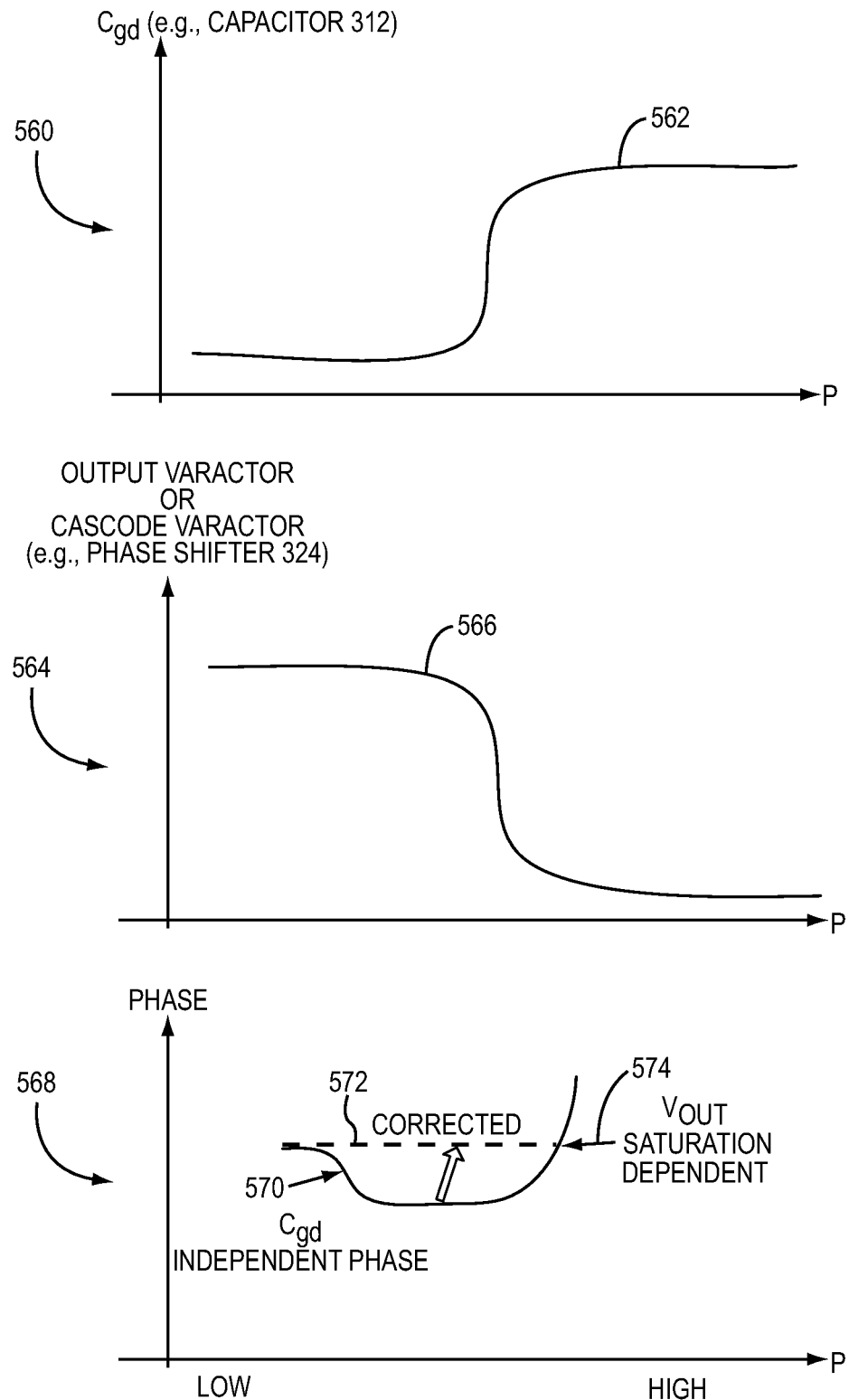

FIG. 23 graphs a gate-drain capacitance as a function of power, and other variables a function of power.

Figure 24:
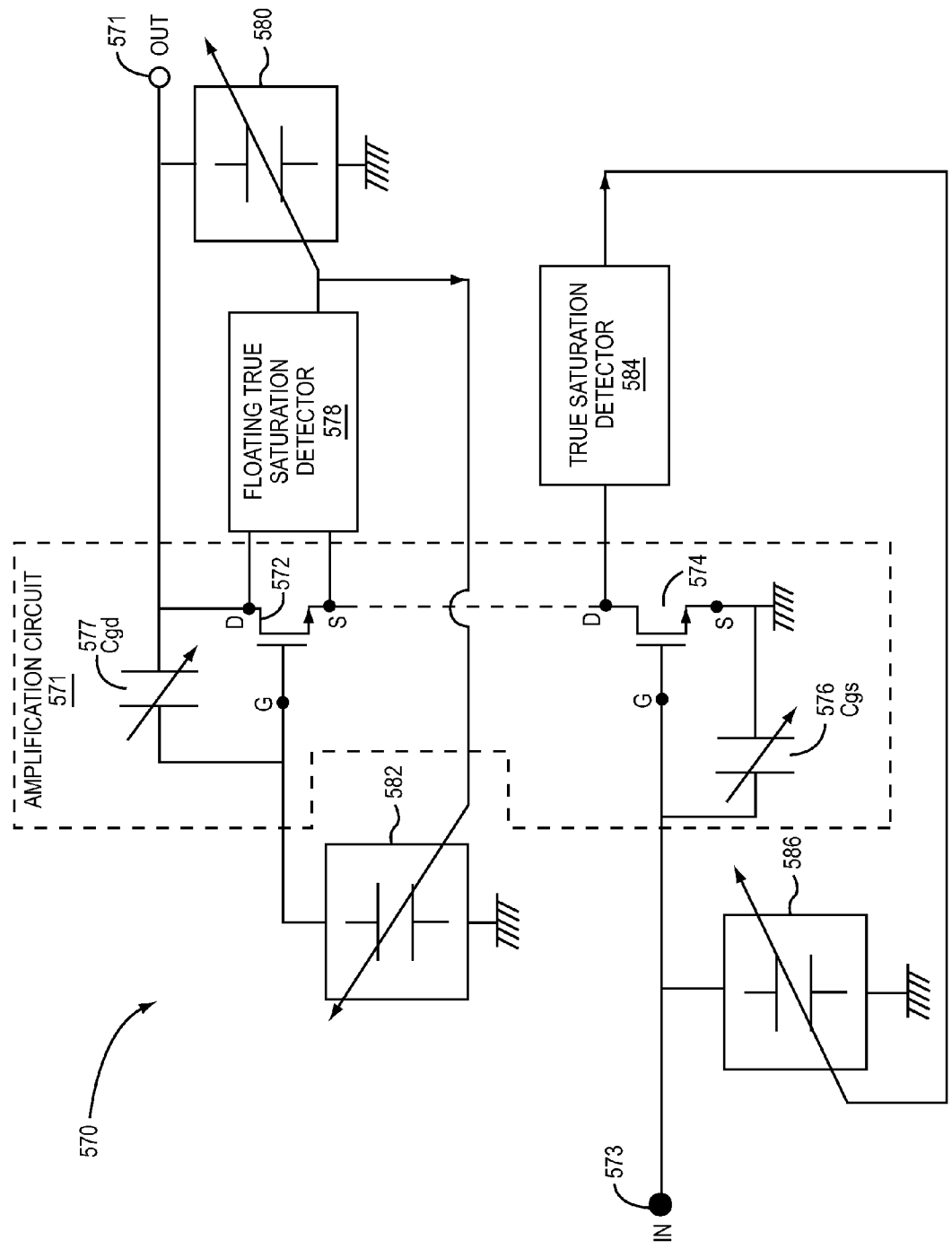

FIG. 24 illustrates a communication circuit including two true saturation detectors.

Figure 25:
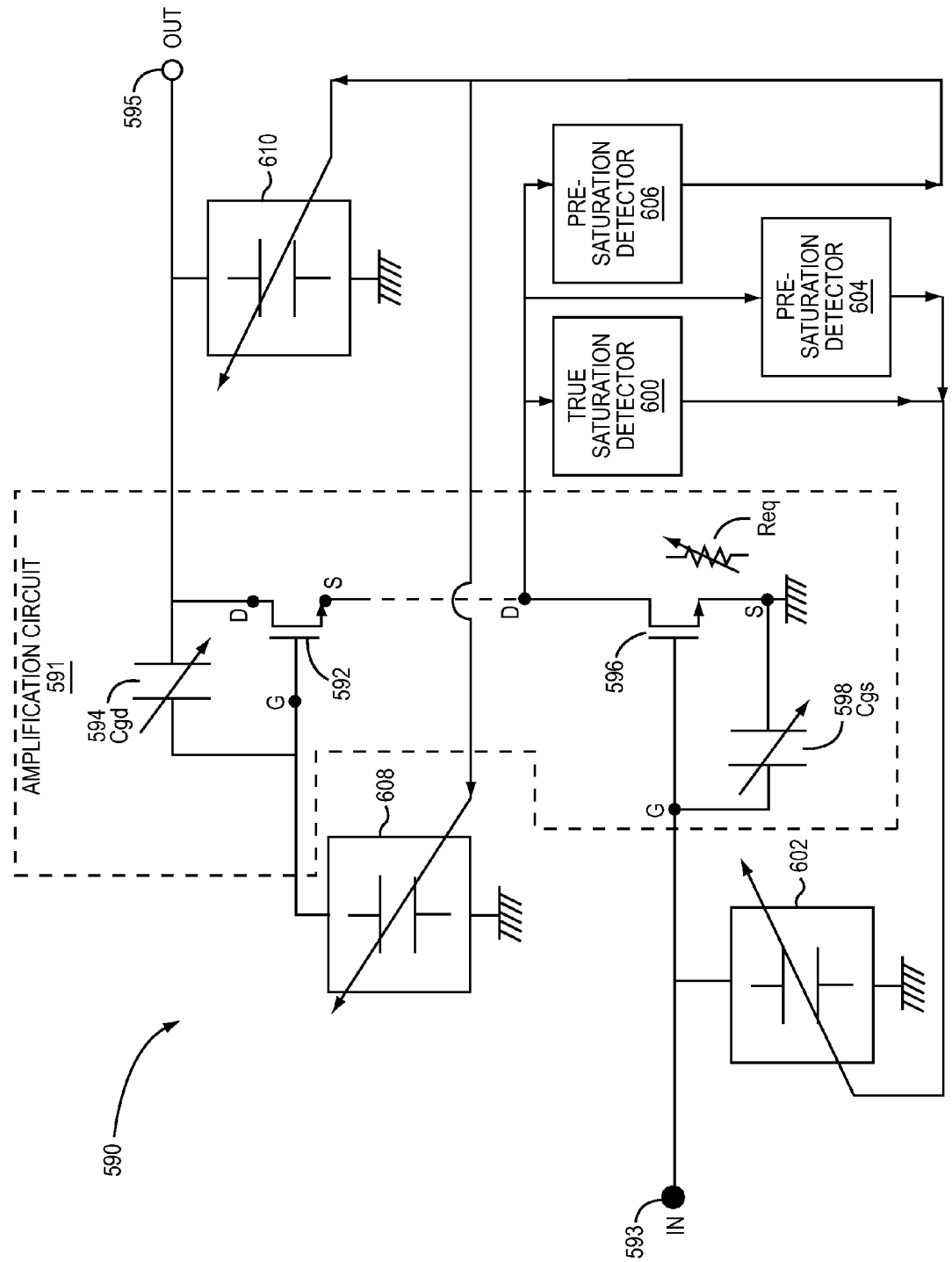

FIG. 25 illustrates a communication circuit including true saturation detector and two pre-saturation detectors.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

With regard to the term "terminus," terminus refers to any conductive feature in an electronic component for receiving signals, transmitting signals, and/or establishing a connection to another electronic component. For instance, a terminus may be one or more nodes, ports, conductive pads, pins, solder bumps, terminals, leads, pins, and/or the like. To provide an example with regard to receiving and/or transmitting a single-ended signal, a terminus may be provided as a single terminal utilized to receive and/or transmit the single-ended signal. However, to be clear, this disclosure is not in any way limited to single-ended signals. Thus, to provide an example with regard to differential signals, a terminus may be provided as a pair of terminals for receiving and/or transmitting a positive and negative side of the differential signal.

With regard to the term "endogenous," endogenous refers to a signal, parameter, or action being derived and/or originating internally within an electronic component. For example, a set point for a closed-loop circuit is established endogenously by the closed-loop circuit, if the set point is derived and/or originates internally within the closed-loop circuit. In contrast, with regard to the term "exogenous," exogenous refers to a signal, parameter, or action being derived and/or originating externally from the electronic component. For example, the set point for a closed-loop circuit is established endogenously with respect to the closed-loop circuit, if the set point is derived and/or originates in external control circuitry outside of the closed-loop circuit.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

This disclosure relates to (radio frequency) RF communication systems for transmitting and/or receiving RF signals. In particular, this disclosure relates to RF amplification devices and methods for amplifying RF signals. As such, embodiments of exemplary RF amplification devices are described herein to comprehensively explain various innovative concepts and techniques related to the disclosure. In order to help describe these innovative concepts and techniques, the exemplary RF amplification devices disclosed herein include examples of exemplary circuits and circuit elements. To further elucidate these innovative concepts and techniques, the exemplary RF amplification devices are sometimes described as being employed within certain types of RF communication systems. It should be noted that the scope of this disclosure is not limited to the exemplary RF amplification device, circuits, circuit components, and RF communication systems specifically described herein. Rather, the scope of this disclosure extends to any and all systems, devices, circuits, circuit components and methods (whether described explicitly or implicitly) in accord with the innovative concepts and techniques described in this disclosure.

The innovative concepts and techniques described in this disclosure described herein can be used to amplify an RF signal with high power efficiency and/or by introducing low distortion. While not required, the exemplary RF amplification devices may thus be used to amplify RF signals provided within various RF communication bands and/or formatted in accordance with various RF communication standards in order to allow for wide-band amplification operations. However, the exemplary RF amplification devices described may implement to operate with increased autonomy and thus provide wide-band amplification operations with less or no support from other components within the RF communication system. The exemplary RF amplification devices can thus be easily provided within the RF communication system without requiring major customization and/or coordination with other system devices.

Figure 1:
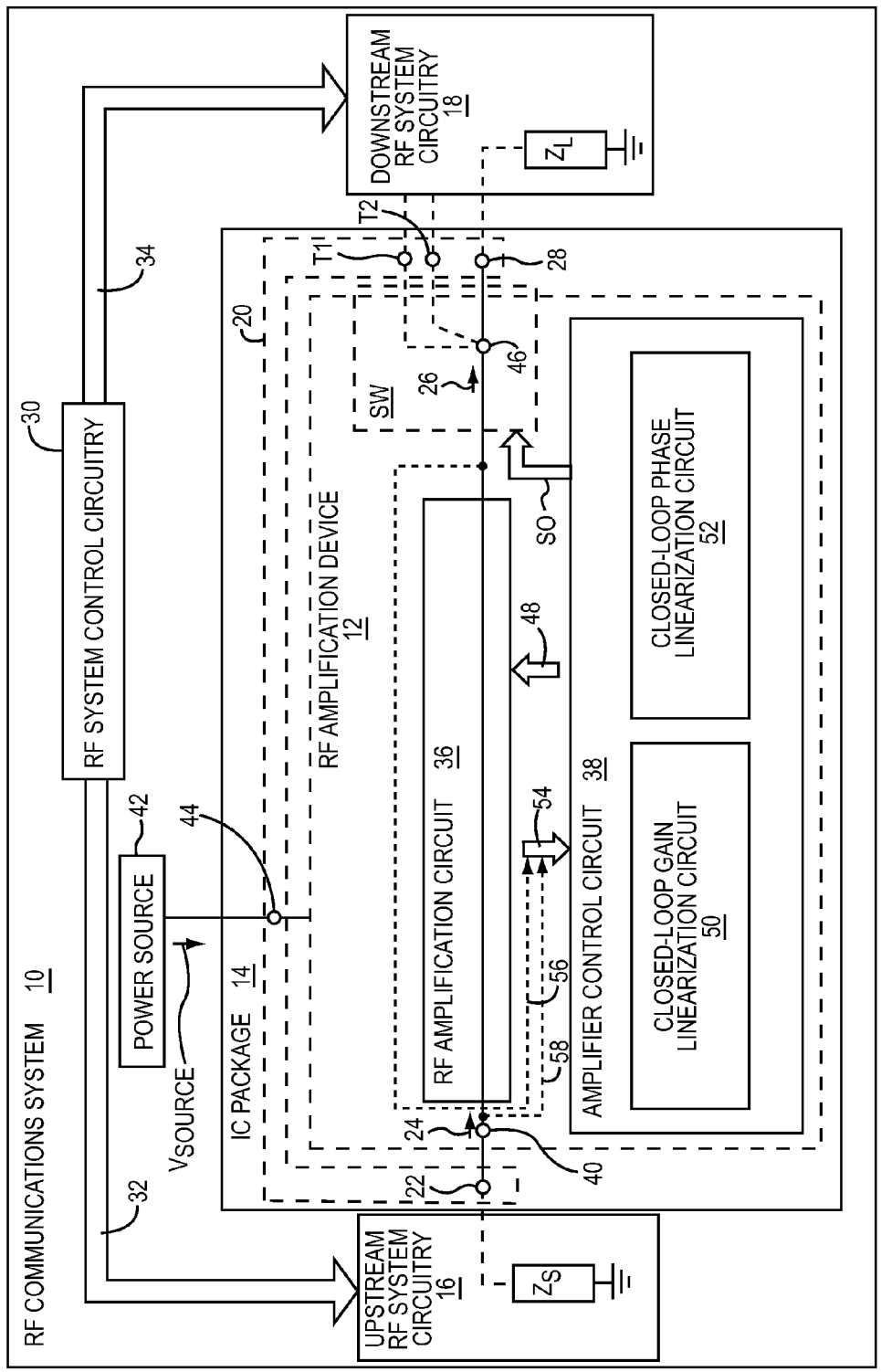
FIG. 1 illustrates a block diagram of an exemplary radio frequency (RF) communications system that includes an exemplary RF amplification device integrated into an exemplary integrated circuit (IC) package.

FIG. 1 illustrates a block diagram of one embodiment of an RF communications system 10. The RF communications system 10 may be any type of communication system capable of transmitting and/or receiving wireless communications signals. For example, the RF communications system 10 may be provided as an RF front-end module in a portable computing device (i.e., cellular phone, tablet, laptop) configured to transmit and/or receive information on one or more wireless communication networks. The RF communications system 10 may include one or more antennas and various transceiver chains (i.e., receiver chains and/or transmit chains) that process RF signals within different communication bands, formatted in accordance with different RF communication standards, and/or in accordance with different RF communication specifications for these RF communication standards.

In FIG. 1, the RF communications system 10 includes an exemplary RF amplification device 12 provided in an integrated circuit (IC) package 14. The RF amplification device 12 is coupled between upstream RF system circuitry 16 and downstream RF system circuitry 18 within the RF communications system 10. For example, the upstream RF system circuitry 16, the RF amplification device 12, and downstream RF system circuitry 18 may be or may be part of either one or more transmit chains or one or more receive chains within the RF communications system 10. The IC package 14 houses the RF amplification device 12 and allows the RF amplification device 12 to transmit and receive signals within the RF communications system 10 and external to the IC package 14. More specifically, the IC package 14 includes a package interface 20 configured to connect the RF amplification device 12 to external circuitry within the RF communications system 10. It should be noted that embodiments of the RF amplification device 12 may be provided as discrete component implementations.

As shown in FIG. 1, the package interface 20 includes a first package terminus 22 coupled to the upstream RF system circuitry 16. For example, the RF communications system 10 may be an RF transceiver and the upstream RF system circuitry 16, the RF amplification device 12, and downstream RF system circuitry 18 may be provided so as to form one or more transmit chains of the RF transceiver. As such, the RF communications system 10 may be provided in a user communication device, such as a laptop, a cellular phone, a tablet, a personal computer, or the like. In a transmit chain or in transmit chains, the upstream RF system circuitry 16 may include baseband circuitry and up-conversion circuitry that generates an RF signal 24. As such, the RF signal 24 is exogenous to the IC package 14 and thus the package interface 20 is coupled to the upstream RF system circuitry 16 in order to receive the RF signal 24 when the RF signal 24 is transmitted from the upstream RF system circuitry 16. More specifically, the IC package 14 receives the RF signal 24 at the first package terminus 22. The upstream RF system circuitry 16 thus provides a source of the RF amplification device 12 and presents a source impedance ZS at the first package terminus 22.

In the transmit chain(s), the RF amplification device 12 is configured to provide amplification prior to transmission by the RF communications system 10 from an antenna. As such, the RF amplification device 12 is configured to provide amplification to the RF signal 24 and generate an amplified RF signal 26. The amplified RF signal 26 is transmitted externally from a second package terminus 28 in the package interface 20 of the IC package 14 to the downstream RF system circuitry 18. A load of the RF amplification device 12 is thus provided by the downstream RF system circuitry 18, which presents a load impedance ZL at the second package terminus 28. Since this example presumes that the downstream RF system circuitry 18 is part of one or more transmit chains, the downstream RF system circuitry 18 includes the antenna of the RF communications system 10 along with an optional impedance tuner or antenna tuner. The downstream RF system circuitry 18 thus transmits the amplified RF signal 26 to the antenna, which emits the amplified RF signal 26.

The RF amplification device 12 shown in FIG. 1 is operable to operate autonomously and thus can be implemented in the RF communications system 10 without significant customization of the other components in the RF communications system 10. For example, the RF communications system 10 includes RF system control circuitry 30 which are external to the RF amplification device 12 and the IC package 14. The RF system control circuitry 30 is configured to provide control operations to coordinate the operations of the RF communications system 10. For example, the RF system control circuitry 30 may be configured to generate system control outputs 32, 34. A system control output 32 is received by the upstream RF system circuitry 16 in order to regulate its performance. Similarly, a system control output 34 is received by the downstream RF system circuitry 18 in order to regulate its performance. For example, the system control output 34 may tune the antenna tuner within the downstream RF system circuitry 18 and vary the load impedance ZL. However, in this embodiment, the IC package 14, and thus the RF amplification device 12, does not receive a control output from the RF system control circuitry 30. Thus, the RF amplification device 12 can be implemented in the RF communications system 10 with little or no customization of the RF system control circuitry 30.

Alternatively, other embodiments of the IC package 14 and the RF amplification device 12 may receive control outputs from the RF system control circuitry 30 depending on the particular application being implemented. Nevertheless, the features of the RF amplification device 12 shown in FIG. 1 allow for the RF amplification device 12 to operate with more autonomy. Furthermore, the RF amplification device 12 may be designed to have wide-band amplification capabilities. Thus, the RF amplification device 12 is operable to amplify the RF signal 24 while allowing the RF signal 24 to be provided within different RF communication bands, to be formatted in accordance with different RF communication standards, and/or to be provided in accordance with different RF communication specifications within those RF communication standards. Exemplary RF communication standards and specifications include 2G Global System for Mobile Communications (GSM) standard (i.e., a Digital Communication System (DCS) specification, a Personal Communications Service (PCS) specification), GSM specifications, Enhanced Data Rates for GSM Evolution (EDGE) specifications of the 3G standard, Wireless Fidelity (Wi-Fi) Local Area Network (LAN) standards, and/or different specifications of the Long Term Evolution (LTE) standard. Furthermore, the RF signal 24 may be multiplexed in accordance with Time Division Duplex (TDD) techniques, Frequency Division Duplex (FDD) techniques, Space Division Multiplexing (SDM), Code Division Multiple Access Multiplexing (CDMA), Orthogonal Frequency Division Multiple Access Multiplexing (OFDMA), LTE diversity techniques, Multiple-Input and Multiple-Output (MIMO) techniques, and/or the like. The RF amplification device 12 is included in an RF signal path for the RF signal 24. The RF communications system 10 may or may not define additional RF signal paths for different communication bands, specifications, and/or communication standards.

The RF amplification device 12 shown in FIG. 1 includes an RF amplification circuit 36 and an amplifier control circuit 38. Thus, the RF amplification circuit 36 and the amplifier control circuit 38 are provided within the IC package 14. The RF amplification circuit 36 is configured to receive the RF signal 24 from the first package terminus 22 at an input terminus 40. A source voltage VSOURCE is generated by a power source 42 and provided to the RF amplification device 12 at a third package terminus 44 in the package interface 20. The source voltage VSOURCE powers the RF amplification circuit 36 and the amplifier control circuit 38 in the RF amplification device 12.

The RF amplification circuit 36 is configured to amplify the RF signal 24 so as to generate the amplified RF signal 26. In other words, the RF amplification circuit 36 provides amplification to the RF signal 24 by transferring power from the source voltage VSOURCE to the RF signal 24 thereby generating the amplified RF signal 26. The RF amplification circuit 36 then outputs the amplified RF signal 26 after amplification from an output terminus 46 coupled to the second package terminus 28. In this manner, the amplified RF signal 26 is transmitted externally to the downstream RF system circuitry 18.

The RF amplification circuit 36 may be configured to amplify the RF signal 24 when the RF signal 24 is provided in any one of plurality of communication bands and/or is formatted in accordance with any one of a multitude of RF communication standards. Often, the RF amplification circuit 36 is divided into RF amplification stages, including one or more driver RF amplification stages and a final RF amplification stage. Alternatively, the RF amplification circuit 36 may be provided having a single amplification stage. Other circuitry may be provided in the RF amplification circuit 36 in order to provide matching and/or to provide filtering so that undesired signal components (e.g., noise, harmonics) are reduced. The RF amplification circuit 36 is configured to amplify the RF signal 24 so as to generate the amplified RF signal 26 in accordance to a transfer function of the RF amplification circuit 36. Since the transfer function of the RF amplification circuit 36 is defined from input to output, the transfer function of the RF amplification circuit 36 shown in FIG. 1 is from the input terminus 40 to the output terminus 46.

Accordingly, as shown in FIG. 1, since the RF signal 24 may be provided within different RF communication bands, may be formatted in accordance with different RF communication standards, and/or may be provided in accordance with different RF communication specifications within those RF communication standards, the RF amplification device 12 may include an optional multiple-throw switch SW between the RF amplification circuit 36 and the downstream RF system circuitry 18. In this manner, the RF signal 24 may be exogenously transmitted to different antenna/impedance tuners (not shown) and antennas (not shown) in the downstream RF system circuitry 18, which may each be designed for particular or a particular combination RF communication bands, RF communication standards, and/or RF communication specifications. In this case, the output terminus 46 may be a pole port provided in the multiple-throw switch SW. The second package terminus 28 in the package interface 20 may be a throw port of the multiple-throw switch SW. However, the multiple-throw switch SW include any number of additional throw ports, such as the additional package termini T1, T2 in the package interface 20. The multiple-throw switch SW may be configured to selectively connect the output terminus 46 to any of the package termini T1, T2, 28. In this manner, the multiple-throw switch SW can be used to route the amplified RF signal 26 to the appropriate antenna tuner and the appropriate antenna in the downstream RF system circuitry 18. In one embodiment, the amplifier control circuit 38 is configured to generate a switching output SO to control the multiple-throw switch SW. The multiple-throw switch SW is responsive to the switching output SO so as to selectively connect the output terminus 46 to one of the package termini T1, T2, 28.

With regard to the amplifier control circuit 38, the amplifier control circuit 38 is operably associated with the RF amplification circuit 36 and is configured to control the transfer function of the RF amplification circuit 36. To do this, the amplifier control circuit 38 is configured to generate a control output 48, which may include one or more control signals that may be utilized to control the transfer function of the RF amplification circuit 36. For example, the amplifier control circuit 38 may include biasing circuitry that generates one or more bias signals, RF power converters (i.e., Low-Drop Out Regulators, RF switching converters, charge pumps, the like, or any combination thereof) that generate one or more supply voltages from the source voltage VSOURCE to power the RF amplification circuit 36, phase shifting components, and/or control blocks that generate control signals to adjust characteristic values in the RF amplification circuit 36. As such, the control output 48 generated by the amplifier control circuit 38 may include one or more bias signals, one or more supply voltages, and/or one or more control signals from the control blocks.

As shown in FIG. 1, the amplifier control circuit 38 also includes a closed-loop gain linearization circuit 50 and a closed-loop phase linearization circuit 52. In alternative embodiments, the amplifier control circuit 38 may have or operate only one of the two closed-loop linearization circuits 50, 52. It may also include open-loop linearization circuits. Both the closed-loop gain linearization circuit 50 and the closed-loop phase linearization circuit 52 are configured to increase linearization of a response characteristic defined by the transfer function of the RF amplification circuit 36. More specifically, with regards to the closed-loop gain linearization circuit 50, the response characteristic is a gain defined by the transfer function of the RF amplification circuit 36. Accordingly, the closed-loop gain linearization circuit 50 is configured to increase linearity of the gain of the RF amplification circuit 36. With regards to the closed-loop phase linearization circuit 52, the response characteristic is a phase shift defined by the transfer function of the RF amplification circuit 36. Accordingly, the closed-loop phase linearization circuit 52 is configured to increase linearity of the phase shift of the RF amplification circuit 36. Thus, the closed-loop phase linearization circuit 52 is configured to keep the phase shift of the RF amplification circuit 36 approximately constant. The closed-loop gain linearization circuit 50 and the closed-loop phase linearization circuit 52 provide increase linearity of the gain and the phase shift, respectively, within a communication band of interest of the RF signal 24, which may be a processed modulation signal. In some embodiments, the closed-loop gain linearization circuit 50 and the closed-loop phase linearization circuit 52 substantially linearize the gain and the phase shift, respectively. However, in other embodiments, the closed-loop gain linearization circuit 50 and the closed-loop phase linearization circuit 52 may simply reduce non-linearity.

To regulate the transfer function of the RF amplification circuit 36, the closed-loop gain linearization circuit 50 and the closed-loop phase linearization circuit 52 are each configured to generate one or more control signals. These control signals may be part of the control output 48 provided by the amplifier control circuit 38 to the RF amplification circuit 36. Thus, the control signals generated by the closed-loop gain linearization circuit 50 and the closed-loop phase linearization circuit 52 may be used to directly regulate the transfer function of the RF amplification circuit 36. Additionally and/or alternatively, the control signals may be utilized as inputs to other circuitry within the amplifier control circuit 38. For example, the control signals may be used to regulate the biasing circuitry, the RF power converters, and/or may be utilized as inputs to the control blocks that generate control signals for adjusting the characteristic values in the RF amplification circuit 36. As such, the control signals generated by the closed-loop gain linearization circuit 50 and the closed-loop phase linearization circuit 52 may be used to indirectly regulate the transfer function of the RF amplification circuit 36.

The amplifier control circuit 38 is configured to receive a control input 54 from the RF amplification circuit 36. The control input 54 may include various control signals that indicate parameter values related to the performance of the RF amplification circuit 36. In this regard, the closed-loop gain linearization circuit 50 and the closed-loop phase linearization circuit 52 are closed loop because the control signals generated by the closed-loop gain linearization circuit 50 and the closed-loop phase linearization circuit 52 depend on an output (i.e., the amplified RF signal 26) of the RF amplification circuit 36 or an analog of the output. As such, the control input 54 includes at least one feedback signal 56 that depends on the amplified RF signal 26 or an analog of the amplified RF signal 26.

As mentioned above, the RF amplification device 12 can operate autonomously while still providing wide-band amplification operations. To do this, the closed-loop gain linearization circuit 50 and the closed-loop phase linearization circuit 52 each endogenously establish a set point of the amplified RF signal 26 using the RF signal 24. Accordingly, the RF amplification device 12 and the IC package 14 do not receive an external control signal from the RF communications system 10, such as a reference signal from the RF system control circuitry 30, in order to establish the set points of the closed-loop gain linearization circuit 50 and the closed-loop phase linearization circuit 52. Instead, the closed-loop gain linearization circuit 50 and the closed-loop phase linearization circuit 52 each are configured to establish their respective set points endogenously within the IC package 14. As such, the control input 54 includes at least one reference signal 58 that depends on the RF signal 24. The control input 54 may also include exogenous control signals (e.g., from other package termini) that are received by the closed-loop gain linearization circuit 50 and/or the closed-loop phase linearization circuit 52. For example, these exogenous control signals may indicate a communication band, an RF communication standard, an RF communication specification, and/or a signal frequency of the RF signal 24. These exogenous control signals may be used to change operational characteristics of the closed-loop gain linearization circuit 50 and/or the closed-loop phase linearization circuit 52, such as an operational bandwidth and/or harmonic filter frequencies of the closed-loop gain linearization circuit 50 and/or the closed-loop phase linearization circuit 52.

While the closed-loop gain linearization circuit 50 is activate, the transfer function of the RF amplification circuit 36 defines a closed-loop gain response, and while the closed-loop gain linearization circuit 50 is inactive, the transfer function of the RF amplification circuit 36 defines an open-loop gain response. The amplified RF signal 26 has a signal amplitude, which is related to a signal amplitude (i.e., signal envelope level) of the RF signal 24 by the gain of the RF amplification circuit 36. The set point endogenously established by the closed-loop gain linearization circuit 50 is a target reference amplitude of the signal amplitude of the amplified RF signal 26. The closed-loop gain linearization circuit 50 is configured to set the target reference amplitude according to a target gain magnitude of the gain of the RF amplification circuit 36. In other words, the target reference amplitude indicates what the signal amplitude of the amplified RF signal 26 should be in order to set a gain magnitude of the gain of the RF amplification circuit 36 to the target gain magnitude. As such, the set point of the closed-loop gain linearization circuit 50 is also the target gain magnitude.

Similarly, while the closed-loop phase linearization circuit 52 is activate, the transfer function of the RF amplification circuit 36 defines a closed-loop phase response and, while the closed-loop phase linearization circuit 52 is inactive, the transfer function of the RF amplification circuit 36 defines an open-loop phase response. The set point endogenously established by the closed-loop phase linearization circuit 52 is a target reference phase of the amplified RF signal 26. The amplified RF signal 26 has a signal phase, which is related to a signal phase of the RF signal 24 by a phase shift of the RF amplification circuit 36. The closed-loop gain linearization circuit 50 is configured to set the target reference phase based on the target phase magnitude of the phase shift provided by the RF amplification circuit 36. For example, if the target phase magnitude is approximately zero (0) degrees, then the target reference phase may be approximately equal to the signal phase of the RF signal 24. If the target phase magnitude is approximately one hundred eighty (180) degrees, then the target reference phase may be approximately equal to an inverse of the signal phase of the RF signal 24. By establishing the set points of the closed-loop gain linearization circuit 50 and the closed-loop phase linearization circuit 52 endogenously using the RF signal 24, the RF amplification device 12 can operate autonomously while increasing the linearity of the transfer function of the RF amplification circuit 36. In this manner, the RF amplification device 12 can provide high linearity amplification operations without requiring exogenous control signals from the RF communications system 10 that indicate the set points.

The embodiment of the amplifier control circuit 38 shown in FIG. 1 includes both the closed-loop gain linearization circuit 50 and the closed-loop phase linearization circuit 52. However, it should be noted that in alternative embodiments, the amplifier control circuit 38 may only include either the closed-loop gain linearization circuit 50 or the closed-loop phase linearization circuit 52. Whether both or either of the closed-loop gain linearization circuit 50 and the closed-loop phase linearization circuit 52 are provided may depend on the particular performance characteristics of the RF amplification circuit 36.

Figure 2:
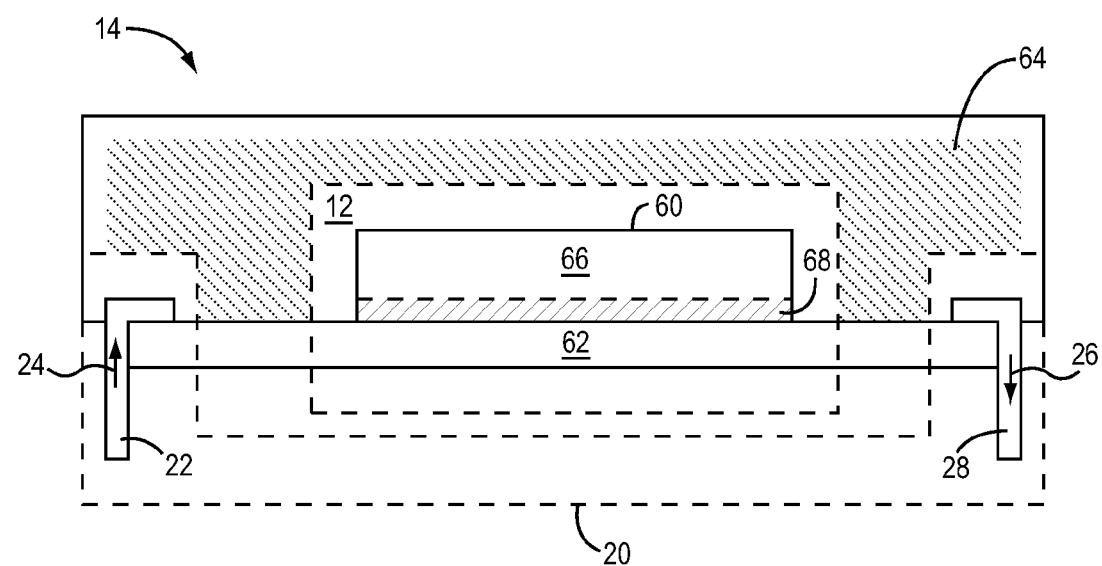
FIG. 2 is a cross-sectional view of an exemplary physical layout of the IC package shown in FIG. 1.

FIG. 2 is a cross-sectional view of an exemplary physical layout of the IC package 14 shown in FIG. 1. The RF amplification device 12 is integrated into the IC package 14 so that the IC package 14 houses the RF amplification device 12. The IC package 14 includes a semiconductor die 60, a package board 62, molding 64, and an exemplary embodiment of the package interface 20 described above in FIG. 1. An IC is formed by the semiconductor die 60. The RF amplification device 12 may be formed partially or entirely by the semiconductor die 60 depending on the application and topology of the RF amplification device 12. In alternative embodiments, the IC package 14 may include multiple semiconductor dice (like the semiconductor die 60) and the RF amplification device 12 may be built on the multiple semiconductor dies. For example, the RF amplification circuit 36 (shown in FIG. 1) and the amplifier control circuit 38 (shown in FIG. 1) may be formed on separate semiconductor dice. Additionally, one or more of the RF amplifier stages 36A, 36B, 36C (shown in FIG. 1) may be built on separate semiconductor dice. Furthermore, the closed-loop gain linearization circuit 50 and the closed-loop phase linearization circuit 52 may be built on separate semiconductor dice. Other types of substrates may be mounted in the IC package 14, such as glass substrates, plastic substrates, or any type of substrate made from a suitable substrate material. Portions of the RF amplification device 12 may be formed on these other types of substrates. These and other combinations would be apparent to one of ordinary skill in the art in light of this disclosure.

With regard to the semiconductor die 60 shown in FIG. 1, the semiconductor die 60 includes a semiconductor substrate 66 used to form active semiconductor components of the IC. The semiconductor substrate 66 may be formed from doped and non-doped layers of a suitable semiconductor material. For example, the semiconductor material may be Silicon (Si), Silicon Germanium (SiGe), Gallium Arsenide (GaAs), Indium Phosphorus (InP), and/or the like. Typical dopants that may be utilized to dope the semiconductor layers are Gallium (Ga), Arsenic (As), Silicon (Si), Tellurium (Te), Zinc (Zn), Sulfur (S), Boron (B), Phosphorus (P), Aluminum Gallium Arsenide (AlGaAs), Indium Gallium Arsenide (InGaAs), and/or the like. Furthermore, metallic layers may be formed on a top, within, and/or a bottom of the semiconductor substrate 66 to provide termini of the active semiconductor components, to form passive impedance elements, and/or the like. Insulating layers, such as oxide layers, and metal layers may also be provided in or on the semiconductor substrate 66. For example, the passive impedance elements may also be formed in or on the semiconductor substrate 66 from the metallic layers.

The semiconductor die 60 also includes a Back-End-of-Line (BEOL) 68, which may be formed from a non-conductive substrate and a plurality of metallic layers provided on or in the insulating substrate. The BEOL 68 is configured to couple the components on the semiconductor substrate 66 to one another. Termini may also be provided by the BEOL 68 to provide connections by external components to the IC. The BEOL 68 may also be used to form passive impedance elements.

A topology of the semiconductor die 60 formed by the semiconductor substrate 66 and the BEOL 68 that form the IC may be in accordance to any suitable semiconductor technology, such as Complementary Metal-On-Oxide Semiconductor technology (CMOS), Bipolar-Complementary Metal-On-Oxide Semiconductor technology (BiCMOS), Silicon-On-Insulator technology (SOI), and/or the like. In this embodiment, the topology of the semiconductor die 60 is provided in accordance with CMOS technology since it is inexpensive, allows the IC to be small, and allows for easy manufacturing. The closed-loop gain linearization circuit 50 (shown in FIG. 1) and the closed-loop phase linearization circuit 52 (shown in FIG. 1) allow for the topology of the semiconductor die 60 to be provided in accordance with CMOS technology while still providing high linearity amplification operations.

The semiconductor die 60 is mounted on the package board 62 within the IC package 14. The package board 62 may be formed by a plurality of board layers formed from a non-conductive material and metallic layers. The non-conductive material that forms the board layers may be a dielectric, a laminate, fibers, glass, ceramic, and/or the like. The dielectric may be a Silicon Oxide (SiOx), Silicon Nitride (SiNx), and/or the like. The laminate may be FR-1, FR-2, FR-3, FR-4, FR-5, FR-6, CEM-1, CEM-2, CEM-3, CEM-4, CEM-5, CX-5, CX-10, CX-20, CX-30, CX-40, CX-50, CX-60, CX-70, CX-80, CX-90, CX-100, and/or the like. The metallic layers of the package board may be used to form termini, passive impedance components, and connections. For instance, the metallic layers are used to form connections between the semiconductor die 60 and the package interface 20. Also, although the RF amplification device 12 may be provided entirely by the IC formed by the semiconductor die 60, components of the RF amplification device 12 may also be formed using the metallic layers in the package board 62. The semiconductor die 60 shown in FIG. 2 is encapsulated by the molding 64, which may be formed from a non-conductive material to help insulate the semiconductor die 60 and the RF amplification device 12. In this manner, the semiconductor die 60 is protected from external electromagnetic noise generated outside the IC package 14.

FIG. 2 also illustrates an example of the package interface 20. In this embodiment, the package interface 20 is coupled to the package board 62 so that signals can be transmitted to and received from circuitry external to the IC package 14. An embodiment of the first package terminus 22 for receiving the RF signal 24 and an embodiment of the second package terminus 28 for transmitting the amplified RF signal 26 are shown in FIG. 2. In this embodiment, the first package terminus 22 and the second package terminus 28 are each provided as pins connected to the package board 62. An embodiment of the third package terminus 44 (shown in FIG. 1 but not FIG. 2) is also provided as a pin connected to the package board 62. As mentioned above, the RF amplification device 12 may be configured to operate autonomously and thus the IC package 14 may have a small number of pins. For example, the IC package 14 may be less than eleven (11) pins. In this embodiment, the IC package 14 has a total of eight (8) pins.

Figure 3:
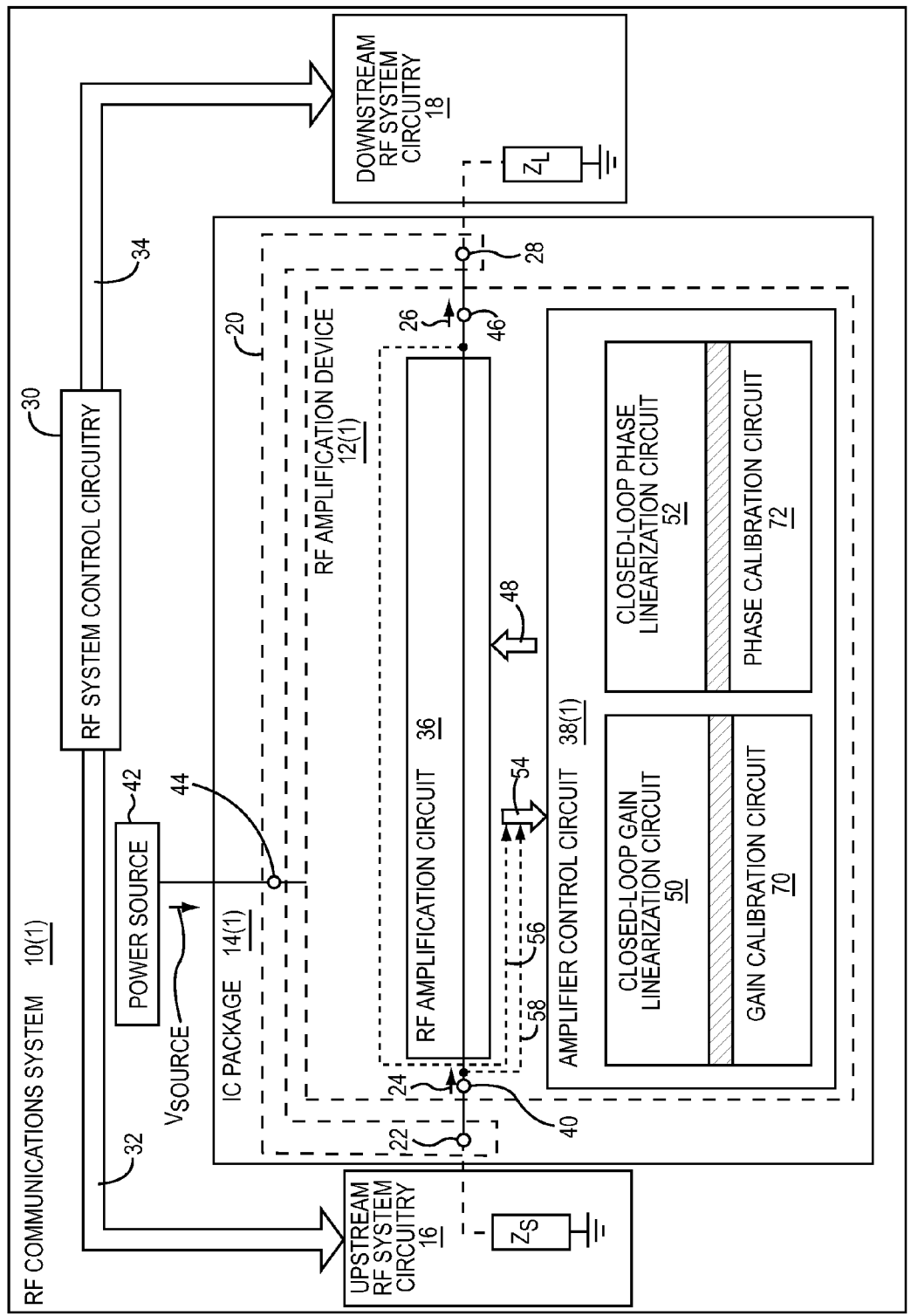
FIG. 3 is a block diagram of another exemplary RF communications system, RF amplification device, and IC package, which are embodiments of the RF communications system, the RF amplification device, and the IC package described above in FIG. 1.

Referring now to FIG. 3, FIG. 3 is a block diagram of another exemplary RF communications system 10(1), RF amplification device 12(1), and an IC package 14(1) that houses the RF amplification device, which are embodiments of the RF communications system 10, the RF amplification device 12, and the IC package 14 described above in FIG. 1. The RF amplification device 12 also includes the RF amplification circuit 36 described above with respect to FIG. 1 along with an amplifier control circuit 38(1). The amplifier control circuit 38(1) is one embodiment of the amplifier control circuit 38 described above with respect to FIG. 1. However, in this embodiment, the amplifier control circuit 38(1) further includes a gain calibration circuit 70 and a phase calibration circuit 72. Alternative embodiments of the amplifier control circuit 38(1) may include only the gain calibration circuit 70 or the phase calibration circuit 72.

Slanted lines are included between the gain calibration circuit 70 and the closed-loop gain linearization circuit 50 in order to indicate that the gain calibration circuit 70 and the closed-loop gain linearization circuit 50 may be partially integrated with one another (and thus share components) or may be independent (and thus not share components). As explained in further below, at small-signal power levels, the closed-loop gain linearization circuit 50 may be deactivated and thus the RF amplification circuit 36 may amplify the RF signal 24 in accordance with the open-loop gain response defined by the transfer function of the RF amplification circuit 36. At these small-signal power levels when the closed-loop gain linearization circuit 50 is inactive, the open-loop gain response may be substantially linear. As discussed above, while the closed-loop gain linearization circuit 50 is activate, the closed-loop gain response defined by the transfer function is also linear. However, without the gain calibration circuit 70, the gain of the RF amplification circuit 36 may be different during the closed-loop gain response and the open-loop gain response. The gain calibration circuit 70 is configured to reduce a difference between the closed-loop gain response and the open-loop gain response. For example, the gain calibration circuit 70 may be configured to substantially eliminate the difference between the closed-loop gain response and the open-loop gain response. Accordingly, the gain of the RF amplification circuit 36 may be substantially the same during the closed-loop gain response and the open-loop gain response.

With regard to the phase-calibration circuitry, slanted lines are included between the phase calibration circuit 72 and the closed-loop phase linearization circuit 52 in order to indicate that the phase calibration circuit 72 and the closed-loop phase linearization circuit 52 may be partially integrated with one another (and thus share components) or may be independent (and thus not share components). As explained further below, at small-signal power levels, the closed-loop phase linearization circuit 52 may be inactive and thus the RF amplification circuit 36 may amplify the RF signal 24 in accordance with the open-loop phase response defined by the transfer function of the RF amplification circuit 36. At these small-signal power levels when the closed-loop phase linearization circuit 52 is inactive, the open-loop phase response may be substantially linear. As discussed above, while the closed-loop phase linearization circuit 52 is activate, the closed-loop phase response defined by the transfer function is also linear. However, without the phase calibration circuit 72, the phase shift of the RF amplification circuit 36 may be different during the closed-loop phase response and the open-loop phase response. The phase calibration circuit 72 is configured to reduce a difference of the closed-loop phase response and the open-loop phase response. For example, the phase calibration circuit 72 may be configured to substantially eliminate the difference between the closed-loop phase response and the open-loop phase response. Accordingly, the phase shift of the RF amplification circuit 36 may be substantially the same during the closed-loop phase response and the open-loop phase response.

Figure 4:
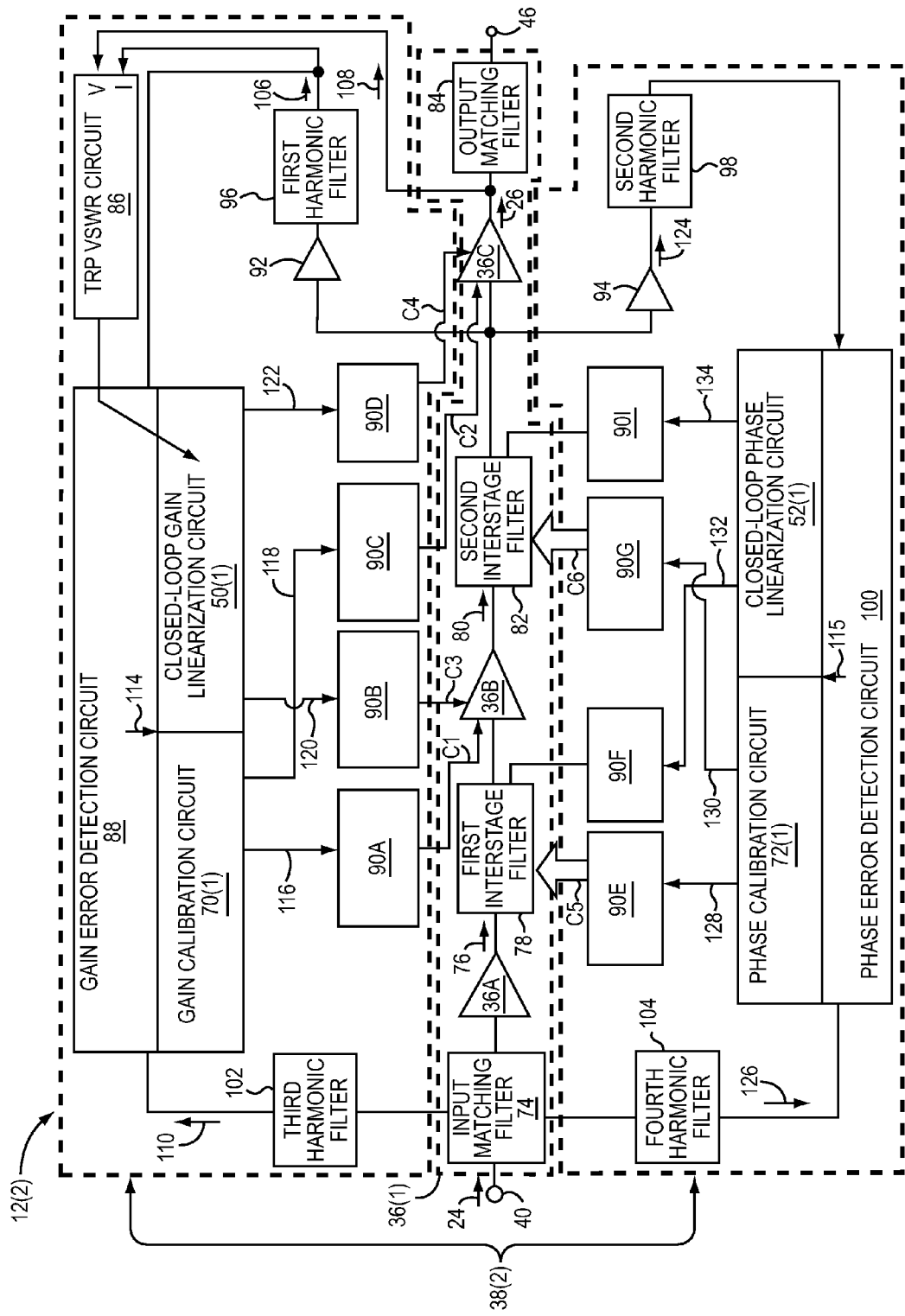
FIG. 4 illustrates a block diagram of another embodiment of an RF amplification device, which is a more detailed example of the RF amplification device shown in FIG. 3.

FIG. 4 illustrates a block diagram of another embodiment of an RF amplification device 12(2), which is a more detailed example of the RF amplification device 12(1) shown in FIG. 3. The RF amplification device 12(2) includes one embodiment of an RF amplification circuit 36(1) and an embodiment of an amplifier control circuit 38(2). The RF amplification circuit 36(1) is one embodiment of the RF amplification circuit 36 described above in FIG. 1. However, in this embodiment, the RF amplification circuit 36(1) includes a plurality of RF amplifier stages 36A, 36B, 36C coupled in cascade. Accordingly, each of the plurality of RF amplifier stages 36A, 36B, 36C is operable to provide amplification and by being coupled in cascade, the RF amplifier stages 36A, 36B, 36C provide amplification to the RF signal 24 in sequence.

The RF amplification circuit 36(1) shown in FIG. 1 has an initial RF amplifier stage 36A, an intermediate RF amplifier stage 36B, and a final RF amplifier stage 36C. However, other embodiments of the RF amplification circuit 36(1) may include any number of RF amplifier stages as described above. Often, the initial RF amplifier stage 36A and the intermediate RF amplifier stage 36B are classified as "driver" RF amplifier stages. Since the final RF amplifier stage 36C handles the most power, some embodiments of the final RF amplifier stage 36C may include arrays of transistors or stacks of transistors in order to handle the power levels seen by the final RF amplifier stage 36C.

In this embodiment, an input matching filter 74 is configured to initially receive the RF signal 24 from the input terminus 40. The input matching filter 74 is configured to substantially match an input impedance of the RF amplification circuit 36(1) to the source impedance ZS (shown in FIG. 1) of the upstream RF system circuitry 16 (shown in FIG. 1). Since the RF amplifier stages 36A, 36B, 36C are coupled in cascade, the RF amplifier stages 36A, 36B, 36C provide amplification to the RF signal 24 in a sequence. Accordingly, the initial RF amplifier stage 36A receives the RF signal 24 from the input matching filter 74. The initial RF amplifier stage 36A is configured to amplify the RF signal 24 so as to generate a first interstage RF signal 76 in accordance with an amplifier gain Ginitial. A first interstage filter 78 is coupled between the initial RF amplifier stage 36A and the intermediate RF amplifier stage 36B. The first interstage filter 78 is configured to filter undesired signal components (e.g., noise and/or harmonics) from the first interstage RF signal 76 after amplification by the initial RF amplifier stage 36A. Once the RF signal 24 is amplified by the initial RF amplifier stage 36A and the first interstage RF signal 76 has been filtered by the first interstage filter 78, the intermediate RF amplifier stage 36B receives the first interstage RF signal 76.

The intermediate RF amplifier stage 36B is configured to amplify the first interstage RF signal 76 so as to generate a second interstage RF signal 80 in accordance with an amplifier gain Gintermediate. A second interstage filter 82 is coupled between the intermediate RF amplifier stage 36B and the final RF amplifier stage 36C. The second interstage filter 82 is configured to filter undesired harmonics from the second interstage RF signal 80 after amplification by the intermediate RF amplifier stage 36B. Once the first interstage RF signal 76 is amplified by the intermediate RF amplifier stage 36B and the second interstage RF signal 80 has been filtered by the second interstage filter 82, the final RF amplifier stage 36C receives the second interstage filter 82. The final RF amplifier stage 36C is configured to amplify the RF signal 24 so as to generate the amplified RF signal 26 in accordance to an amplifier gain Gfinal. As such, the gain of the RF amplification circuit 36(1) may be described as Ginitial*Gintermediate*Gfinal. An output matching filter 84 is coupled to the final RF amplifier stage 36C so as to receive the amplified RF signal 26. The output matching filter 84 is configured to substantially match an output impedance of the RF amplification circuit 36(1) to the load impedance ZL (shown in FIG. 1) of the downstream RF system circuitry 18 (shown in FIG. 1).

The amplifier gain Ginitial, the amplifier gain Gintermediate, and the amplifier gain Gfinal may each be any type of amplifier gain (e.g., a voltage gain, a transconductance gain, a transresistance gain, a current gain) depending on the topology of each of the corresponding RF amplifier stages 36A, 36B, 36C. For example, the amplifier gain Ginitial, the amplifier gain Gintermediate, and the amplifier gain Gfinal may each be the same type of amplifier gain or each may be a different types of amplifier gain. As such, the gain of the RF amplification circuit 36(1) may be any type of amplifier gain depending on a combination of the types amplifier gain Ginitial, the amplifier gain Gintermediate, and the amplifier gain Gfinal provided by each of the RF amplifier stages 36A, 36B, 36C.

Note that as amplification progresses through the sequence of the RF amplifier stages 36A, 36B, 36C, each of the RF amplifier stages 36A, 36B, 36C, handles an increasing amount of power. Therefore, the initial RF amplifier stage 36A handles the least amount of power, since it receives the RF signal 24 prior to amplification and transmits the first interstage RF signal 76 amplified only in accordance with the amplifier gain Ginitial. In one embodiment, the amplifier gain Ginitial is a voltage gain. Thus, the initial RF amplifier stage 36A amplifies the RF signal 24 such that the amplifier gain Ginitial approximately describes a proportion between a voltage level of the first interstage RF signal 76 and a voltage level of the RF signal 24.

When the intermediate RF amplifier stage 36B receives the first interstage RF signal 76, the first interstage RF signal 76 has already been amplified by the amplifier gain Ginitial. The intermediate RF amplifier stage 36B further amplifies the first interstage RF signal 76 and generates the second interstage RF signal 80. Thus, the intermediate RF amplifier stage 36B transmits the second interstage RF signal 80 amplified in accordance with the amplifier gain Ginitial*Gintermediate. As a result, the intermediate RF amplifier stage 36B handles an intermediate amount of power. In one embodiment, the amplifier gain Gintermediate is a transconductance gain. Thus, the intermediate RF amplifier stage 36B amplifies the first interstage RF signal 76 such that the amplifier gain Gintermediate approximately describes a proportion between a current level of the second interstage RF signal 80 and the voltage level of the first interstage RF signal 76.

With regard to the final RF amplifier stage 36C, the final RF amplifier stage 36C receives the second interstage RF signal 80 amplified in accordance with the aggregate amplifier gain Ginitial*Gintermediate. As such, when the final RF amplifier stage 36C further amplifies the second interstage RF signal 80 so as to generate the amplified RF signal 26. In one embodiment, the amplifier gain Gfinal is a current gain. Thus, the final RF amplifier stage 36C amplifies the second interstage RF signal 80 such that the amplifier gain Gfinal approximately describes a proportion between a current level of the amplified RF signal 26 and the current level of the second interstage RF signal 80. The final RF amplifier stage 36C thus transmits the amplified RF signal 26 amplified in accordance with the (total) gain (Ginitial*Gintermediate*Gfinal) of the RF amplification circuit 36(1). As such, the final RF amplifier stage 36C handles the most power. Furthermore the (total) gain of the RF amplification circuit 36(1) is a transconductance gain.

Alternatively, the amplifier gain Gfinal of the final RF amplifier stage 36C may be a transconductance gain. In this alternative embodiment, the output matching filter 84 may be configured to present an input impedance that converts a current level of the amplified RF signal 26 provided by the final RF amplifier stage 36C into a voltage level. Additionally, in another alternative embodiment, the amplifier gain Gintermediate of the intermediate RF amplifier stage 36B is a transconductance gain, and a load impedance of the second interstage filter 82 converts a current level of the second interstage RF signal 80 into a voltage level.

FIG. 4 also illustrates the amplifier control circuit 38(2) used to regulate the RF amplification circuit 36(1). The amplifier control circuit 38(2) includes a closed-loop gain linearization circuit 50(1), a phase calibration circuit 72(1), a gain calibration circuit 70(1), and a phase calibration circuit 72(1), which are embodiments of the closed-loop gain linearization circuit 50, the phase calibration circuit 72, the gain calibration circuit 70, and the phase calibration circuit 72 described above with respect to FIGS. 1 and 3. The amplifier control circuit 38(2) further includes a Total Radiated Power (TRP) Voltage Standing Wave Ratio (VSWR) circuit 86, a gain error detection circuit 88, a driver stage gain control block 90A, a driver stage gain control block 90B, a final stage gain control block 90C, a final stage gain control block 90D, a driver stage phase control block 90E, a driver stage phase control block 90F, a final stage phase control block 90G, a final stage phase control block 90I, a first final stage replica amplifier 92, a second final stage replica amplifier 94, a first harmonic filter 96, a second harmonic filter 98, a phase error detection circuit 100, a third harmonic filter 102, and a fourth harmonic filter 104.

The TRP VSWR circuit 86 is a closed-loop feedback control circuit configured to make a VSWR measurement and adjust a feedback gain of the closed-loop gain linearization circuit 50 in accordance with the VSWR measurement. For example, the TRP VSWR circuit 86 may be configured to adjust the feedback gain of the closed-loop gain linearization circuit 50 in accordance with the VSWR measurement so as to maintain an output power level of the amplified RF signal 26 substantially constant over a range of the load impedance ZL (shown in FIG. 1). The TRP VSWR circuit 86 may be configured to adjust the feedback gain of the closed-loop gain linearization circuit 50 in accordance with the VSWR measurement so as to maintain the closed-loop gain linearization circuit 50 out of unstable control regions. In order to make the VSWR measurement, the TRP VSWR circuit 86 is configured to receive a first feedback signal 106 and a second feedback signal 108. The first feedback signal 106 has a first feedback signal level that is indicative of a current level of the amplified RF signal 26. The second feedback signal 108 has a second feedback signal level that is indicative of a voltage level of the amplified RF signal 26. As such, the TRP VSWR circuit 86 is configured to make the VSWR measurement using the first feedback signal 106 and the second feedback signal 108. In combination, the first feedback signal level of the first feedback signal 106 and the second feedback signal level of the second feedback signal 108 are indicative of TRP of the amplified RF signal 26.

In this embodiment, the closed-loop gain linearization circuit 50 and the gain calibration circuit 70 are partially amalgamated since the closed-loop gain linearization circuit 50 and the gain calibration circuit 70 share the gain error detection circuit 88. Alternatively, the closed-loop gain linearization circuit 50 and the gain calibration circuit 70 may each have independent error detection circuits (like the gain error detection circuit 88) and may thus be independent of one another. In this embodiment, the gain error detection circuit 88 is configured to receive the first feedback signal 106 and a first reference signal 110 having a reference signal level that is indicative of a power level of the RF signal 24. Using the first reference signal 110, the gain error detection circuit 88 is configured to set the set point of the closed-loop gain linearization circuit, which is indicative of the target reference amplitude of the amplified RF signal 26. The set point therefore further indicates the target gain magnitude, and is established based on the reference signal level of the first reference signal 110. By having the TRP VSWR circuit 86 adjust the feedback gain based on the VSWR measurement and using the first feedback signal 106, the gain error detection circuit 88 is configured to provide feedback indicative of a signal power level of the amplified RF signal 26. The gain error detection circuit 88 is configured to compare the feedback and the set point to generate a gain error signal 114 having an error signal level indicative of a power level error between the feedback and the set point. For example, the reference signal level may indicate a current level of the amplified RF signal 26. Given an impedance value of the load impedance ZL (shown in FIG. 1), the current level indicates the signal power level. If the impedance value changes to a different impedance value, the TRP VSWR circuit 86 adjusts the feedback gain so that the current level of the amplified RF signal 26 continues to indicate the signal power level of the amplified RF signal 26. As such, the reference signal level also indicates the signal power level.

The gain error signal 114 is provided to the closed-loop gain linearization circuit 50(1) and the gain calibration circuit 70(1). With regard to the gain calibration circuit 70(1), the gain calibration circuit 70(1) is configured to use the gain error signal 114 to determine calibration points as explained in further detail below. In this embodiment, the gain calibration circuit 70(1) is operably associated with the driver stage gain control block 90A and the final stage gain control block 90C. As shown in the following description, two or more gain control blocks 90A, 90C can be provided to operate with more than one of the RF amplifier stages 36A, 36B, 36C. In this embodiment, the gain calibration circuit 70(1) is configured to generate a first gain calibration signal 116 which is received by the driver stage gain control block 90A and a second gain calibration signal 118 which is received by the final stage gain control block 90C. The driver stage gain control block 90A is configured to generate a control signal C1 that sets the gain of the intermediate RF amplifier stage 36B while the final stage gain control block 90C is configured to generate a control signal C2 that sets the gain of the final RF amplifier stage 36C. With the first gain calibration signal 116 and the second gain calibration signal 118, the gain calibration circuit 70(1) is configured to control the driver stage gain control block 90A and the final stage gain control block 90C and thereby control the gain of the RF amplification circuit 36(1). As explained in further detail below, the gain calibration circuit 70(1) controls the gain of the RF amplification circuit 36(1) in order to reduce the difference between the open-loop gain response and closed-loop gain response of the RF amplification circuit 36(1). In one exemplary embodiment, the driver stage gain control block 90A is an impedance control and the control signal C1 is an impedance control signal that sets an internal impedance level of the intermediate RF amplifier stage 36B. Additionally, the final stage gain control block 90C is a final stage biasing circuit and the control signal C2 is a bias signal that sets a quiescent operating level of the final RF amplifier stage 36C. In alternative embodiments, the gain control blocks 90A, 90C may be configured to control other operational characteristics such as biasing, impedance, and the like.

With regard to the closed-loop gain linearization circuit 50(1), the closed-loop gain linearization circuit 50(1) is configured to adjust the gain of the RF amplification circuit 36(1) in accordance to the gain error signal 114 while activated so as to maintain the gain of the RF amplification circuit 36(1) relatively constant. In this embodiment, the closed-loop gain linearization circuit 50(1) is operably associated with the driver stage gain control block 90B and the final stage gain control block 90D. The closed-loop gain linearization circuit 50(1) is configured to generate a first gain control signal 120 which is received by the driver stage gain control block 90B and a second gain control signal 122 which is received by the final stage gain control block 90D. The driver stage gain control block 90B is configured to generate a control signal C3 that sets the gain of the intermediate RF amplifier stage 36B while the final stage gain control block 90D 90CF is configured to generate a control signal C4 that sets the gain of the final RF amplifier stage 36C. With the first gain control signal 120 and the second gain control signal 122, the closed-loop gain linearization circuit 50(1) is configured to control the driver stage gain control block 90B and the final stage gain control block 90D and thereby control the gain of the RF amplification circuit 36(1). As explained in further detail below, the closed-loop gain linearization circuit 50(1) regulates the gain of the RF amplification circuit 36(1) in order to maintain the closed-loop gain response of the RF amplification circuit 36(1) substantially constant. In one exemplary embodiment, the driver stage gain control block 90B is an impedance control block with a low pass filter and the control signal C3 is an impedance control signal that sets an internal impedance level of the intermediate RF amplifier stage 36B. Additionally, the final stage gain control block 90D is a biasing circuit with a low pass filter and the control signal C4 is a bias signal that sets the quiescent operating level of the final RF amplifier stage 36C.

With regard to phase control, the closed-loop phase linearization circuit 52(1) and the phase calibration circuit 72(1) are partially amalgamated since the closed-loop phase linearization circuit 52(1) and the phase calibration circuit 72(1) share a phase error detection circuit 100. Alternatively, the closed-loop phase linearization circuit 52(1) and the phase calibration circuit 72(1) may each have independent error detection circuits (like the phase error detection circuit 100) and may thus be independent of one another. In this embodiment, the phase error detection circuit 100 is configured to receive a third feedback signal 124 having a third feedback signal level that indicates a phase of the amplified RF signal 26 and a second reference signal 126 having a second reference signal level that is indicative of a phase of the RF signal 24. Using the second reference signal 126, the phase error detection circuit 100 is configured to set the set point of the closed-loop phase linearization circuit 52(1), which is indicative of a target phase shift of the RF amplification circuit 36(1). The phase error detection circuit 100 is also configured to compare measure the phase shift of the RF amplification circuit 36(1) using the third feedback signal 124 and the second reference signal 126 as feedback. The phase error detection circuit 100 generates a phase error signal 115 having an error signal level indicative of a phase shift error between the feedback and the set point (reference).

The phase error signal 115 is provided to the closed-loop phase linearization circuit 52(1) and the phase calibration circuit 72(1). With regard to the phase calibration circuit 72(1), the phase calibration circuit 72(1) is configured to use the phase error signal 115 to determine calibration points as explained in further detail below. In this embodiment, the phase calibration circuit 72(1) is operably associated with the driver stage phase control block 90E and the final stage phase control block 90G. The phase calibration circuit 72(1) is configured to generate a first phase calibration signal 128 which is received by the driver stage phase control block 90E and a second phase calibration signal 130 which is received by the final stage phase control block 90G. The driver stage phase control block 90E is configured to generate a control output C5 that sets a phase shift of the intermediate RF amplifier stage 36B while the final stage phase control block 90G is configured to generate a control output C6 that sets a phase shift of the final RF amplifier stage 36C. With the first phase calibration signal 128 and the second phase calibration signal 130, the phase calibration circuit 72(1) is configured to control the driver stage phase control block 90E and the final stage phase control block 90G and thereby regulate the phase shift of the RF amplification circuit 36. As explained in further detail below, the phase calibration circuit 72(1) controls the phase shift of the RF amplification circuit 36 in order to reduce the difference between the open-loop phase response and closed-loop phase response of the RF amplification circuit 36. In one exemplary embodiment, the driver stage phase control block 90E is an impedance control circuit and the control output C5 is a control word that sets a capacitance of a capacitor bank in the first interstage filter 78. Additionally, the final stage phase control block 90G is an impedance control circuit and the control output C6 is a control word that sets a capacitance of a capacitor bank in the second interstage filter 82.

With regard to the closed-loop phase linearization circuit 52(1), the closed-loop phase linearization circuit 52(1) is configured to adjust the phase shift of the RF amplification circuit 36 in accordance to the phase error signal 115 while activated so as to maintain the phase shift of the RF amplification circuit 36 relatively constant. In this embodiment, the closed-loop phase linearization circuit 52(1) is operably associated with the driver stage phase control block 90F and the final stage phase control block 90I. The closed-loop phase linearization circuit 52(1) is configured to generate a first phase control signal 132 which is received by the driver stage phase control block 90F and a second phase control signal 134 which is received by the final stage phase control block 90I. The driver stage phase control block 90F is configured to set the phase shift of the first interstage filter 78 and/or the intermediate RF amplifier stage 36B using the first phase control signal 132, while the final stage phase control block 90I is configured to set the phase shift of the second interstage filter 82 and/or the final RF amplifier stage 36C using the second phase control signal 134. In this manner, the closed-loop phase linearization circuit 52(1) is configured to control the phase shift of the RF amplification circuit 36(1). In one exemplary embodiment, the driver stage phase control block 90F is a varactor and the first phase control signal 132 is used to set a variable capacitance of the varactor. Additionally, the final stage phase control block 90I may also be a varactor and the second phase control signal 134 is used to set a variable capacitance of the varactor.

To avoid the use of bulky couplers for power detection, a first final stage replica amplifier 92 is configured to generate the first feedback signal 106. As mentioned above, the first feedback signal level of the first feedback signal 106 is indicative of the current level of the amplified RF signal 26. However, in this embodiment, the first feedback signal 106 is not generated as direct feedback resulting from the amplified RF signal 26. Instead, the first final stage replica amplifier 92 is configured to generate the first feedback signal 106 as an analog of the amplified RF signal 26. The first final stage replica amplifier 92 is a scaled-down version of the final RF amplifier stage 36C and is coupled to receive the second interstage RF signal 80 just like the final RF amplifier stage 36C. The first final stage replica amplifier 92 is configured to generate the first feedback signal 106 such that the first feedback signal level is a scaled down replication of the current level of the amplified RF signal 26. Since the first feedback signal 106 is not filtered by the output matching filter 84, the first harmonic filter 96 is configured to filter high-frequency harmonics from the first feedback signal 106 and increase the performance of the gain error detection circuit 88. Furthermore, it should be noted that the TRP VSWR circuit 86 is coupled to receive the second feedback signal 108 before the amplified RF signal 26 is filtered by the output matching filter 84. This avoids a propagation delay of the output matching filter 84, which can be detrimental to the operations of the TRP VSWR circuit 86.

The second final stage replica amplifier 94 shown in FIG. 4 is configured to generate the third feedback signal 124. As mentioned above, the third feedback signal level of the third feedback signal 124 is indicative of the phase of the amplified RF signal 26. In this way, the static or slowly varying phase coming from the load impedance ZL (shown in FIG. 1) is rejected and only the dynamic phase variation is passed to the closed-loop phase linearization circuit 52(1). However, the third feedback signal 124 is not generated as direct feedback resulting from the amplified RF signal 26. Instead, the second final stage replica amplifier 94 is configured to generate the third feedback signal 124 as an analog of the amplified RF signal 26. The second final stage replica amplifier 94 is a scaled-down version of the final RF amplifier stage 36C and is coupled to receive the second interstage RF signal 80 just like the final RF amplifier stage 36C. The second final stage replica amplifier 94 is configured to generate the third feedback signal 124 such that a phase of the third feedback signal 124 matches the phase of the amplified RF signal 26. Since the third feedback signal 124 is not filtered by the output matching filter 84, the second harmonic filter 98 is configured to filter high-frequency harmonics from the third feedback signal 124 and increase the performance of the phase error detection circuit 100.

With regard to reference paths, the third harmonic filter 102 is configured to filter signal components (e.g., noise, harmonics) from the first reference signal 110 and increase the performance of the gain error detection circuit 88. In this manner, the input matching filter 74 can provide impedance matching with the source impedance Zs (shown in FIG. 1) while the third harmonic filter 102 removes unwanted signal components from the first reference signal 110. Similarly, the fourth harmonic filter 104 is configured to filter signal components (e.g., noise, harmonics) from the second reference signal 126 and increase the performance of the gain error detection circuit 88. In this manner, the input matching filter 74 can provide impedance matching with the source impedance Zs (shown in FIG. 1) while the fourth harmonic filter 104 removes unwanted signal components from the second reference signal 126.

Figure 5:
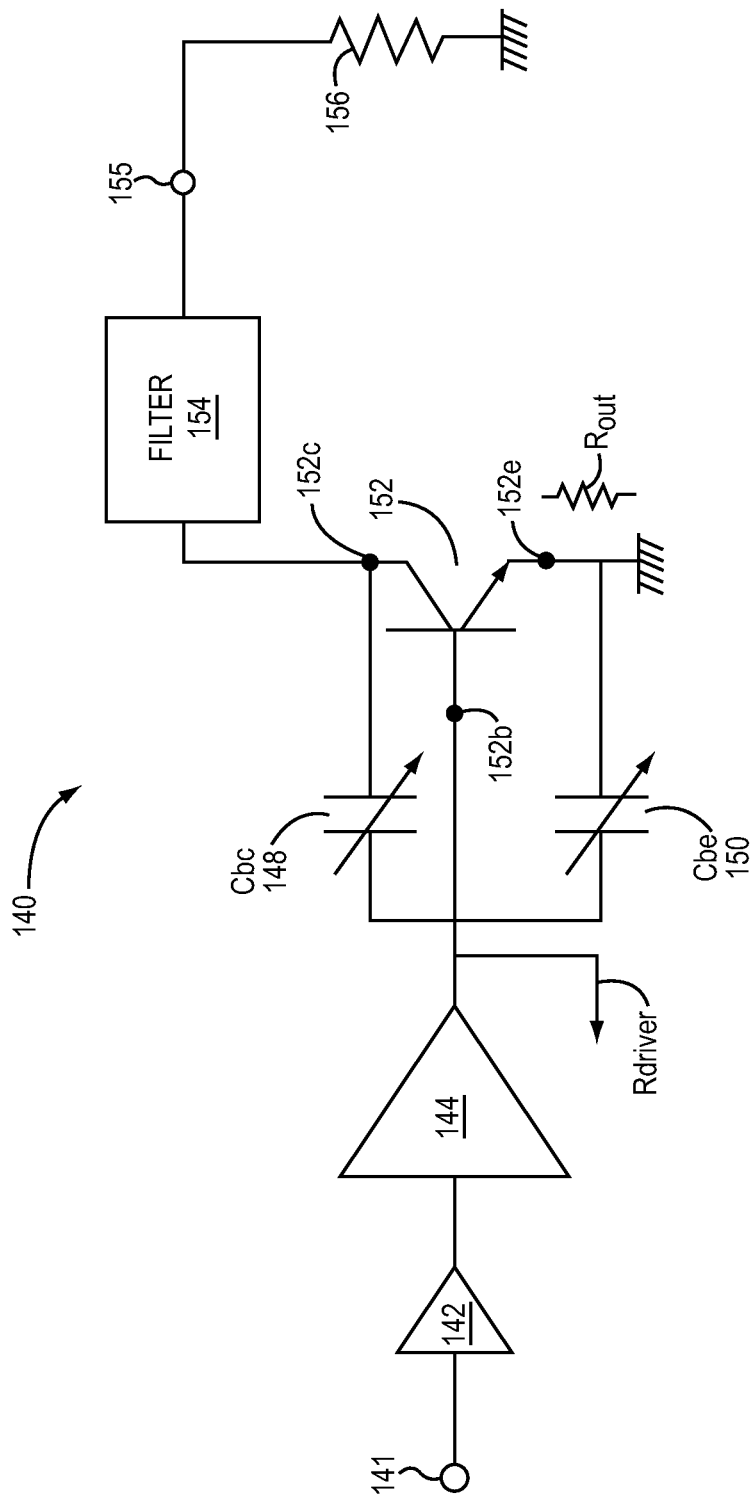
FIG. 5 illustrates a conventional amplification circuit including a single transistor output stage.

FIG. 5 illustrates a conventional amplification circuit including a single transistor output stage. Specifically, FIG. 5 illustrates first conventional amplification circuit 140 including single transistor 152 that is an npn type BJT (bipolar junction transistor).

Input 141 is received by power amplifier 142. Power amplifier 142 is a first stage amplifier. Power amplifier 144 is a second stage (or driver stage) amplifier, and has an output impedance Rdriver.

Output bipolar junction transistor 152 includes nonlinear capacitor 148 (having capacitance Cbc), nonlinear capacitor 150 (having capacitance Cbe), collector 152c, base 152b, and emitter 152e. Collector 152c is connected to filter 154, then output 155, and finally resistive load 156. Rout is the output resistance of the transistor, and is also nonlinear.

Bipolar junction transistor 152 is conventionally a high breakdown voltage transistor (e.g. bipolar, GaAs, etc.). Due to the use of a single device in the high power output stage, the number of nonlinear elements is small (nonlinear capacitors 148 and 150) and these few elements are relatively easy to compensate.

Furthermore, using a process with a large transition frequency $f_T$ that is much higher than the operating frequency of the amplification circuit will push the different pole and zero frequencies significantly above the operating frequency, thus minimizing the AM-PM (amplitude modulation and phase modulation) distortion due to nonlinear signal dependent components. Using a driver (power amplifier 144) with a low output impedance (Rdriver) reduces the PM distortion generated by the nonlinearities of the input referred capacitances Cbe 150 and Cbc 148. Having a single device in the output stage gives the largest available voltage headroom and thus avoids device saturation. Device saturation produces large variations in output resistance Rout.

For these above mentioned reasons, bipolar power amplifiers usually have no AM-PM correction circuitry.

In the case of a complementary metal-oxide-semiconductor (CMOS) power amplifier (not shown), CMOS devices have a relatively low breakdown voltage, and therefore several devices need to be stacked to handle the large output voltage swing, as shown below in FIG. 6. In such a stacked implementation, a large number of nonlinear elements (capacitances and resistances) can contribute to the AM-PM distortion.

Furthermore, the relatively low transition frequency of the CMOS process devices (in comparison with bipolar process devices having similar power handling capabilities) results in corner frequencies that are close to the RF operating frequency, thus resulting in a higher sensitivity to capacitance and resistance nonlinearities.

In view of the limitations of the conventional power amplifiers it would be advantageous to provide a solution that effectively deals with certain aspects of power amplifier distortion correction.

Figure 6:
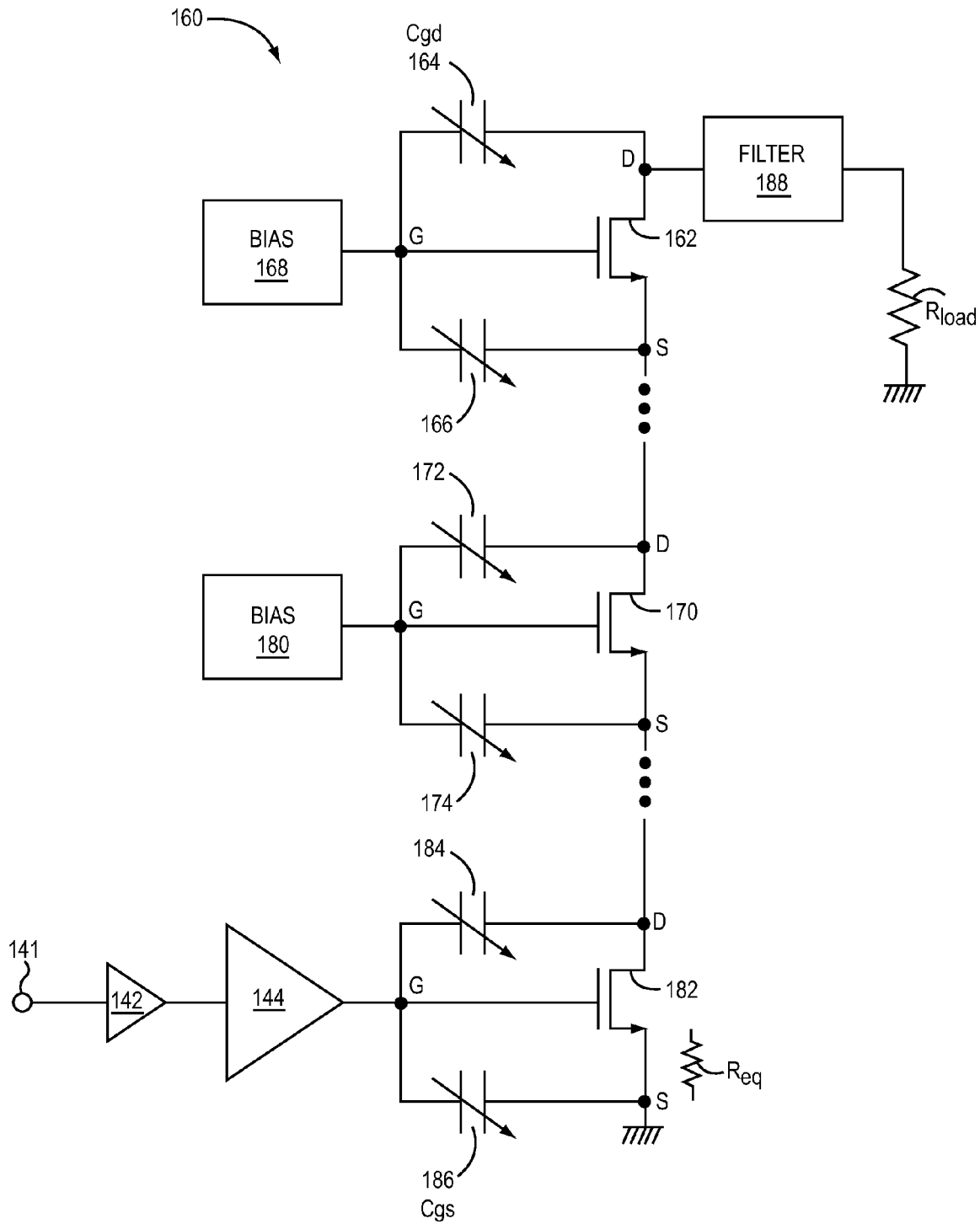
FIG. 6 illustrates a conventional complementary metal-oxide-semiconductor (CMOS) power amplifier with stacked NMOS transistors in the final stage.

FIG. 6 illustrates a conventional complementary metal-oxide-semiconductor (CMOS) power amplifier 160 with stacked NMOS transistors in the final stage. The number of stacked devices can be two or more depending on the output signal level and the breakdown of the devices used.

Specifically, FIG. 6 illustrates input 141, first power amplifier 142, second power amplifier 144 with a low output impedance (Rdriver), and an output stage including a plurality of stacked NMOS transistors including transistor 162, transistor 170, and transistor 182. The output stage has an equivalent resistance Req, includes bias circuits 168 and 180, and outputs to filter 188 and to resistive load Rload. Other transistors may be present in the stack, but are not shown.

In one embodiment the amplifier may have any number of stages, such as only one stage, or two, or three, or more. As such, stages 142 and 144 may or may not be present in power amplifier 160.

Nonlinear elements include: capacitors 164, 166, 172, 174, 184, and 186; and equivalent resistance Req. Nonlinear elements 164 (Cgs), 186 (Cgd) and Req are discussed in detail below.

Figure 7:
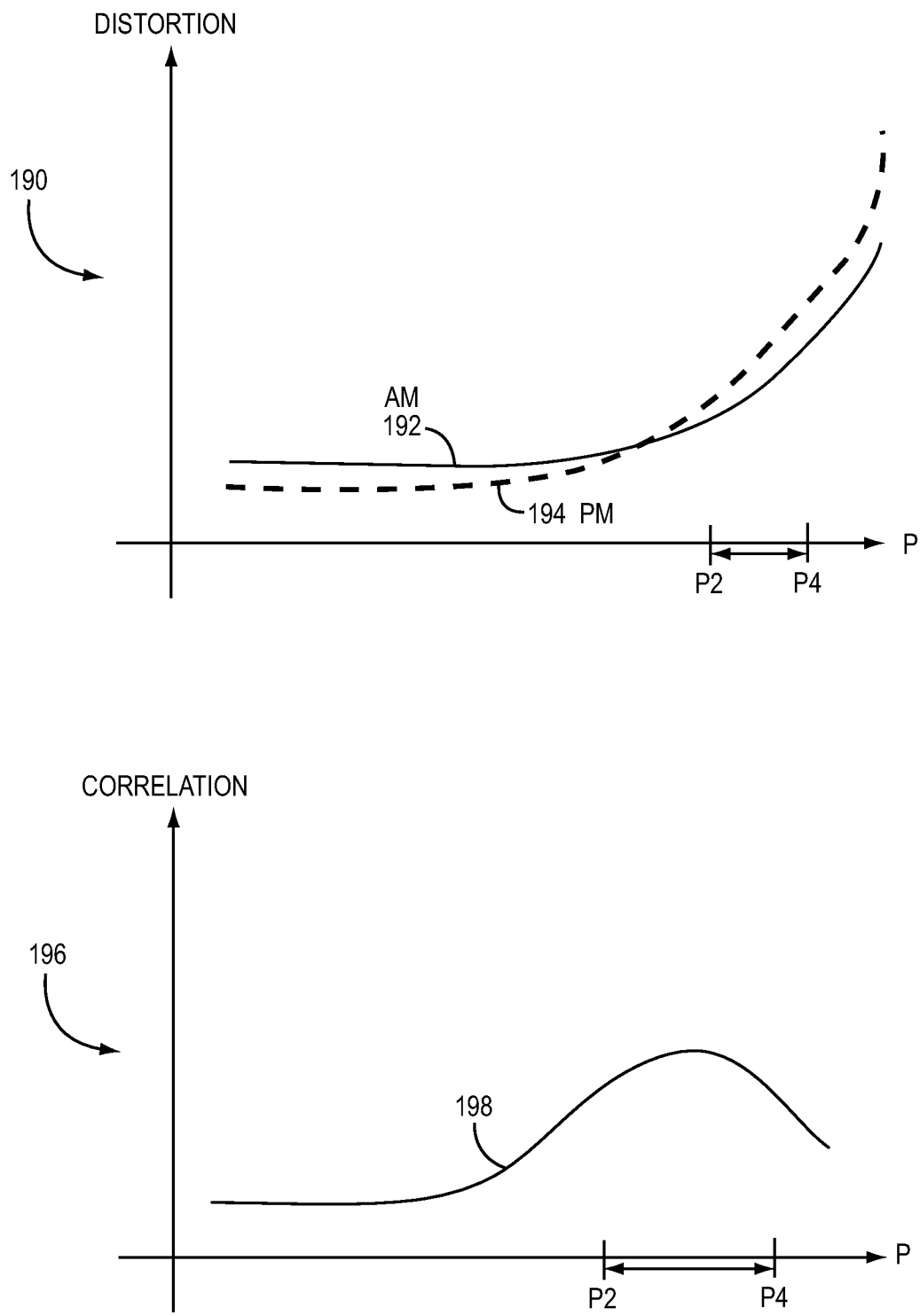
FIG. 7 illustrates a distortion versus power graph for amplitude distortion and phase distortion.

FIG. 7 illustrates a distortion versus power graph 190 for amplitude (AM) distortion 192 (solid line) and phase (PM) distortion 194 (dashed line). The correlation between these distortions is strong in the region between power P2 and power P4.

Graph 196 illustrates the AM distortion 192 and the PM distortion 194 are strongly correlated in the range from power P2 to power P4 along the horizontal power axis (equivalent to P2 and P2 of graph 190, although at a different scale for power). This correlation may be a positive correlation (such as the PM distortion being positive when the AM distortion is positive), or may be a negative correlation (such as the PM distortion being positive when the AM distortion is negative, not shown). These AM and PM distortions are often strongly correlated (strongly positively correlated or strongly negatively correlated) because they are caused by the same nonlinearities in circuit elements of the power amplifier.

Thus, measuring the AM distortion allows a circuit to infer a PM distortion (without measuring a phase distortion, just based on the assumed correlation), and to correct the inferred correlated PM distortion. For example, a person looking out a window may infer an outside temperature based upon the percentage of people that are wearing gloves, because the percentage of people that are wearing gloves is correlated to the outside temperature. This inferred temperature eliminates the need to purchase an outside thermometer.

Similarly, inferring a PM distortion from a measured AM distortion avoids the need to use expensive phase sensors. AM sensors (such as AM saturation sensors) are relatively simple and inexpensive compared to PM sensors. A phase shifting component such as a varactor may be controlled directly by an AM sensor to correct for an inferred phase distortion.

Optionally, a distortion control circuit may receive a signal from an AM sensor, and may perform signal processing to infer a PM distortion and to send an appropriate correction signal to a phase shifter (a phase shifting component such as a varactor). Alternatively, a varactor may be controlled directly by an AM sensor to correct a phase based on an inferred phase distortion.

Figure 8:
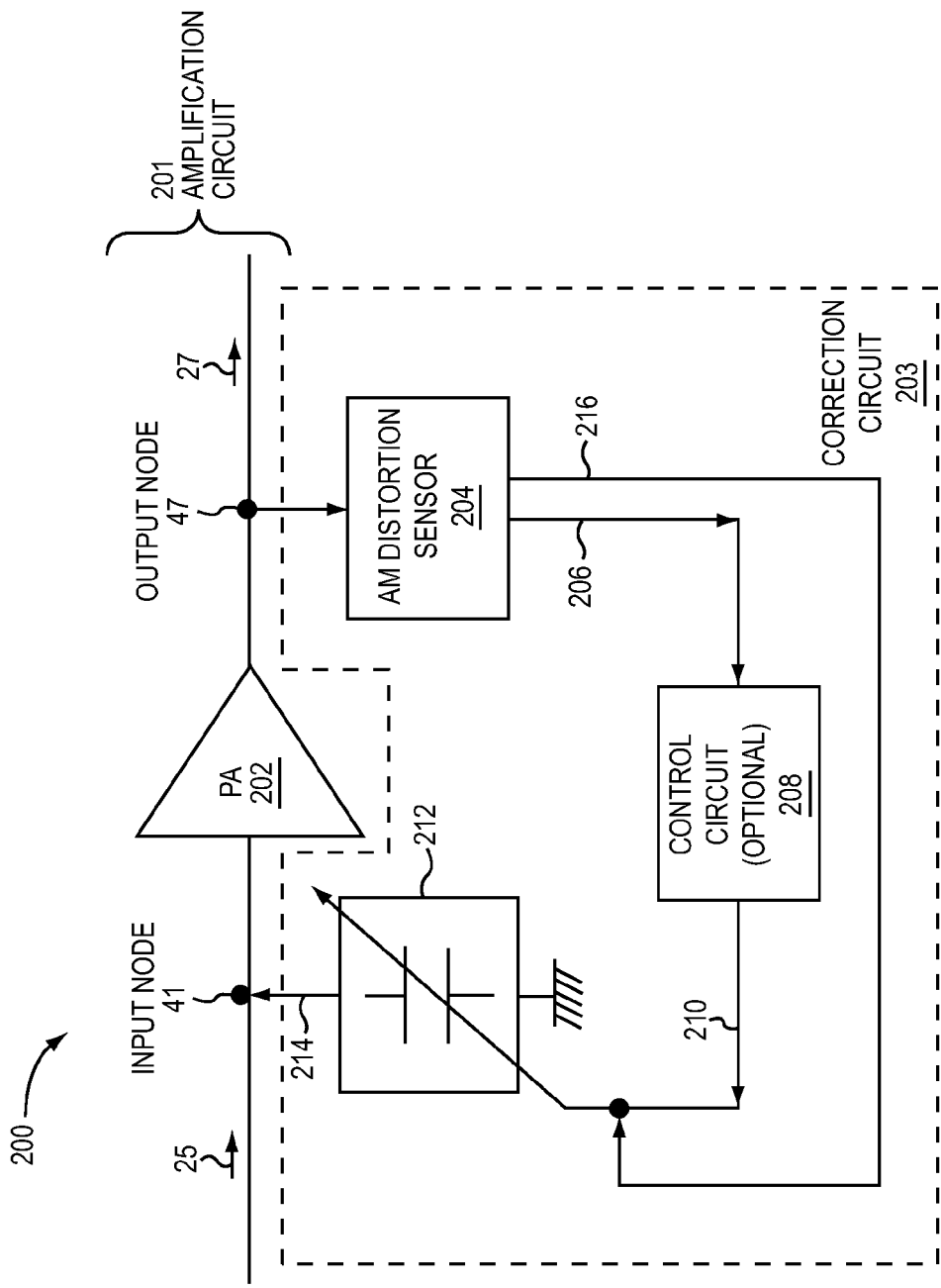
FIG. 8 is a simple example illustrating the use of an amplitude sensor to control a phase shifting component (shifter).

FIG. 8 is a simple example illustrating the use of an amplitude sensor to control a phase shifting component (shifter). Specifically, FIG. 8 illustrates communication circuit 200 including amplification circuit 201 and correction circuit 203.

Amplification circuit 201 includes: input node 41 receiving RF signal 25, power amplifier 202, and output node 47 transmitting amplified RF signal 27. Correction circuit 203 is a feedback loop from output node 47 to input node 41. Correction circuit 203 is a feedback loop because it uses an output of a system to modify an input of a system, but it is not a "classic" feedback loop. These terms are discussed below regarding FIG. 11.

In a first embodiment, amplitude distortion sensor 204 measures the amplitude (or the amplitude distortion) of amplified RF signal 27, and sends sensor signal 206 to optional control circuit 208. In an alternative embodiment, an amplitude sensor may be used. Such sensor does not detect the AM distortion but merely the amplitude of the signal. Amplitude sensor 204 may measure an amplitude of a voltage or an amplitude of a current of amplified RF signal 27.

If the power level at which the AM distortion, and thus the PM correlated distortion happens, then the PM distortion can be corrected. Such signal level when distortion happens varies in general with process, temperature, supply, etc. To perform a reasonable distortion correction the control circuit needs to accommodate for such changes and determine the appropriate correction to happen at the given signal level.

Optional control circuit 208 processes sensor signal 206 to generate control signal 210, and sends control signal 210 to phase shifter 212. Phase shifter 212 may be a varactor (as shown), and may modify the phase distortion of amplified RF signal 27. Phase shifter 212 may also be a variable resistor, or any other variable component (or combination of variable components) that shifts the phase of amplified RF signal 27.

Specifically, this signal processing by control circuit 208 may include estimating (or inferring, or correlating) a phase distortion of amplified RF signal 27 based upon an amplitude (or amplitude distortion) measured by amplitude sensors or amplitude distortion sensor 204, and then generating control signal 201 based at least in part upon the estimated phase distortion.

In a second embodiment, control circuit 208 is eliminated/bypassed, and sensor signal 216 is sent directly to phase shifter 212.

Figure 9:
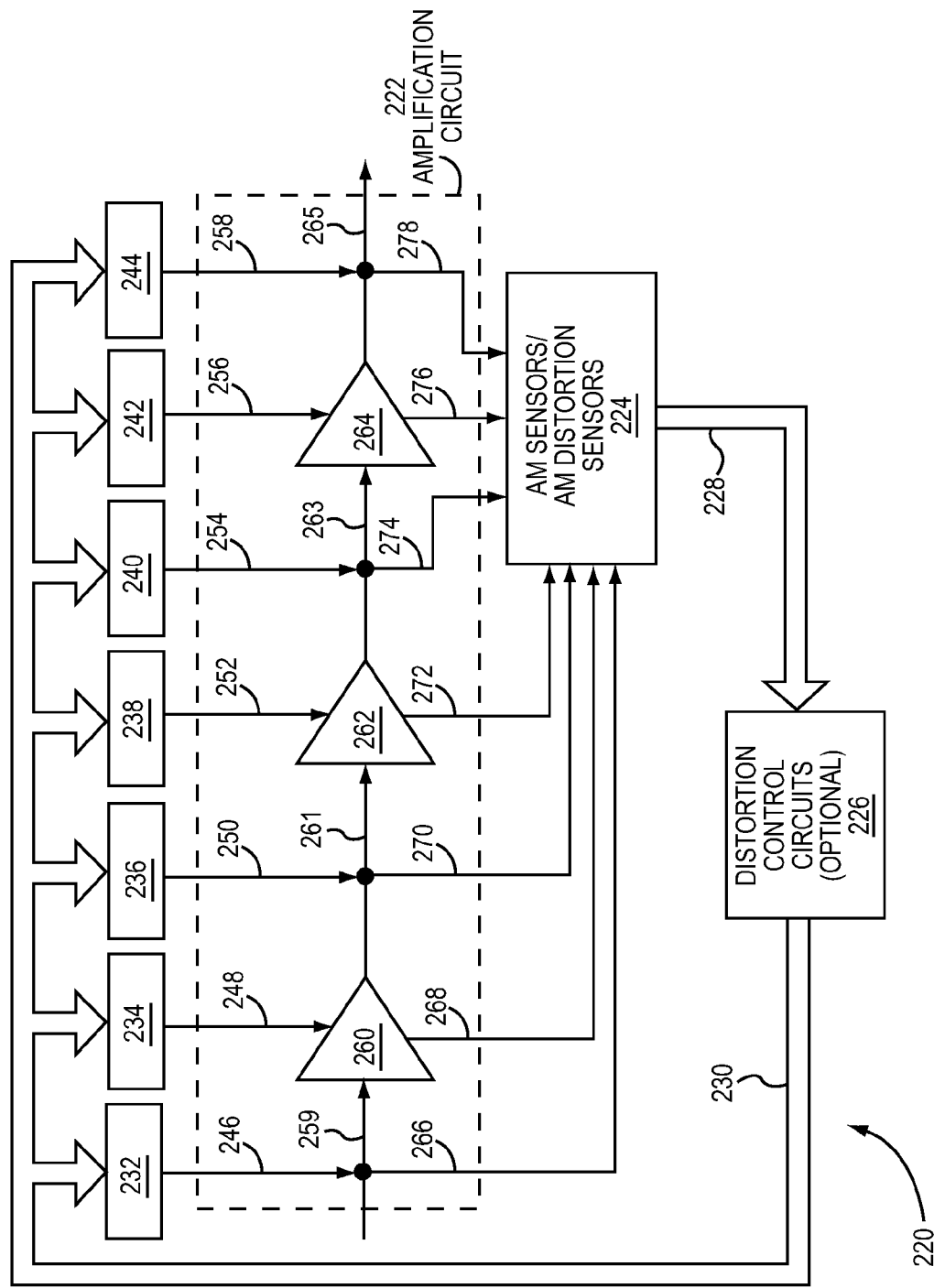
FIG. 9 is a generalized embodiment illustrating many possible combinations of sensors, distortion control circuits, and phase shifting components.

FIG. 9 is a generalized embodiment illustrating many possible combinations of sensors, distortion control circuits, and phase shifters. Generalized RF communications circuit 220 includes amplification circuit 222 including power amplifiers 260, 262, and 264 that may have nonlinear elements. RF signal 259 is amplified into RF signal 261, which is amplified into RF signal 263, which is amplified into RF signal 265.

Amplitudes (or amplitude distortions) are measured by signals 266, 268, 270, 272, 274, 276, and 278 from various points in amplification circuit 220 by amplitude sensor 224. Amplitude/amplitude distortion sensor 224 sends sensor signals 228 to optional distortion control circuits 226. Optional distortion control circuits 226 send control signals 230 to phase shifters 232, 234, 236, 238, 240, 242, and 244. These phase shifters shift the phases of signals in the RF amplification device by interacting with the amplification circuit through paths 246, 248, 250, 252, 254, 256, and 244 respectively. Many specific examples are discussed in later figures.

A "classic" feedback loop compares an output to a reference signal (the reference signal may be the input), generates an error signal based on the difference, and uses the error signal to control the system. The feedback loops in FIG. 9 are not limited to classic feedback. Broadly defined, feedback merely uses an output of a system to influence the system.

For example, signal 274 is downstream from power amplifier 262, and may be used to control phase shifter 236 (upstream from power amplifier 262). This is a feedback loop, but is not a classic feedback loop. Most examples in later figures are not classic feedback loops.

Further, signal 274 is also upstream from power amplifier 264, and may be used to control phase shifter 244 (downstream from power amplifier 264). This is a feed forward loop. Thus, signal 274 may be simultaneously used for a feedback loop and for a feed forward loop.

The term "control loops" includes both feedback loops and feed forward loops. Thus, signal 274 may be used in two distinct control loops: one feedback loop and one feed forward loop.

Generally it is advantageous to correct a non-linearity as locally as possible. For example, a non-linearity in power amplifier 262 may be measured promptly through signal 274, then fed back (through amplitude sensor 224 and distortion control circuit 226) to phase shifter 236.

However, signal 274 may also be fed forward and used to control phase shifter 244 (downstream), in order to correct a predicted or expected nonlinearity in power amplifier 264. One advantage of this feed forward is that RF signal 263 feeding into power amplifier 264 is relatively low power compared to RF signal 265, so signal 263 is easier (and less expensive) to measure. Further, RF signal 265 may be connected to an antenna, and thus may be influenced by signals received by the antenna.

When a stage has stacked devices, there are multiple signal points available within the stage, and multiple sensors may be used. In general, the lower or "bottom" device has the most dramatic impact on distortion and therefore is the most important device to be sensed. In other embodiments sensors can be placed to detect the saturation point of the stacked devices.

Figure 10:
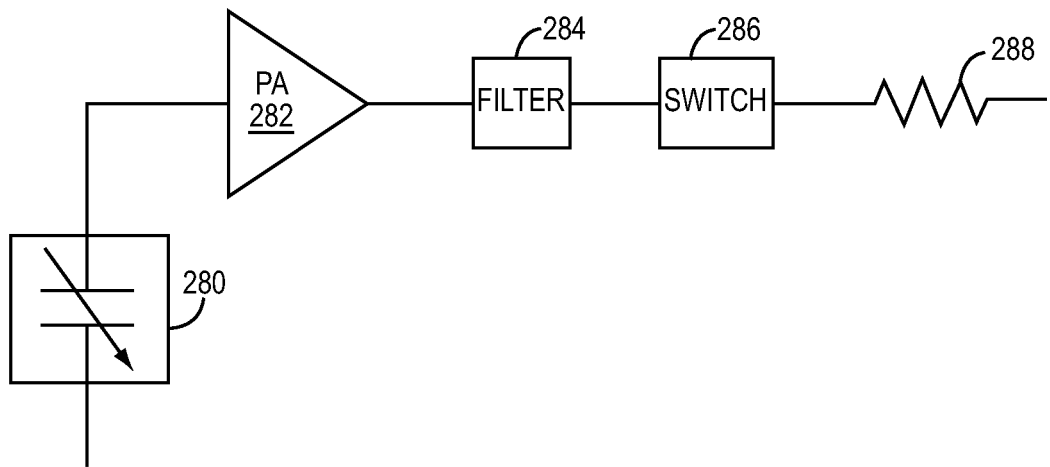
FIG. 10 illustrates exemplary nonlinear elements that may be present in RF amplification circuits.
Figure 10:
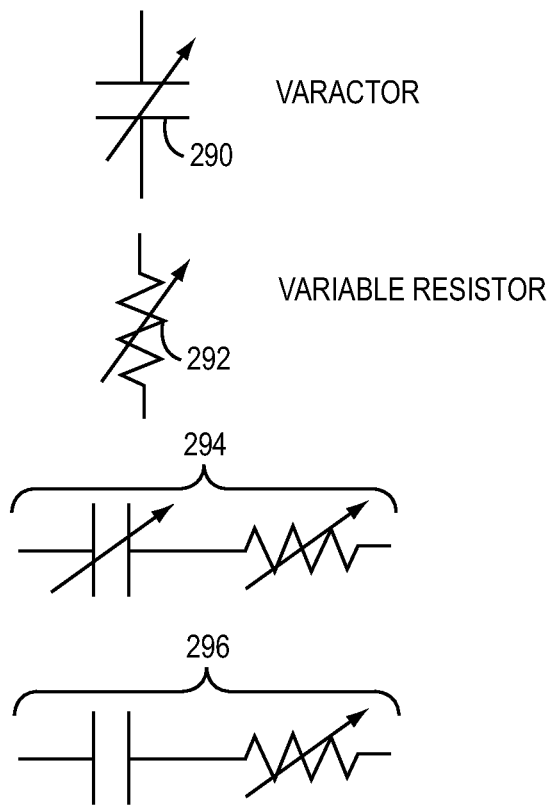

FIG. 10 illustrates exemplary nonlinear elements that may be present in RF amplification circuit 36. Exemplary nonlinear elements include: capacitor 280 (alone or as part of a transistor), power amplifier 282, filter 284, switch 286, and resistor 288.

Additionally, FIG. 10 illustrates exemplary phase shifters that may be used in closed loop phase linearization circuit 52, including: varactor (variable capacitor) 290, variable resistor 292, combination 294 (varactor and variable resistor), and combination 296 (capacitor and variable resistor). Other combinations are possible.

Figure 11:
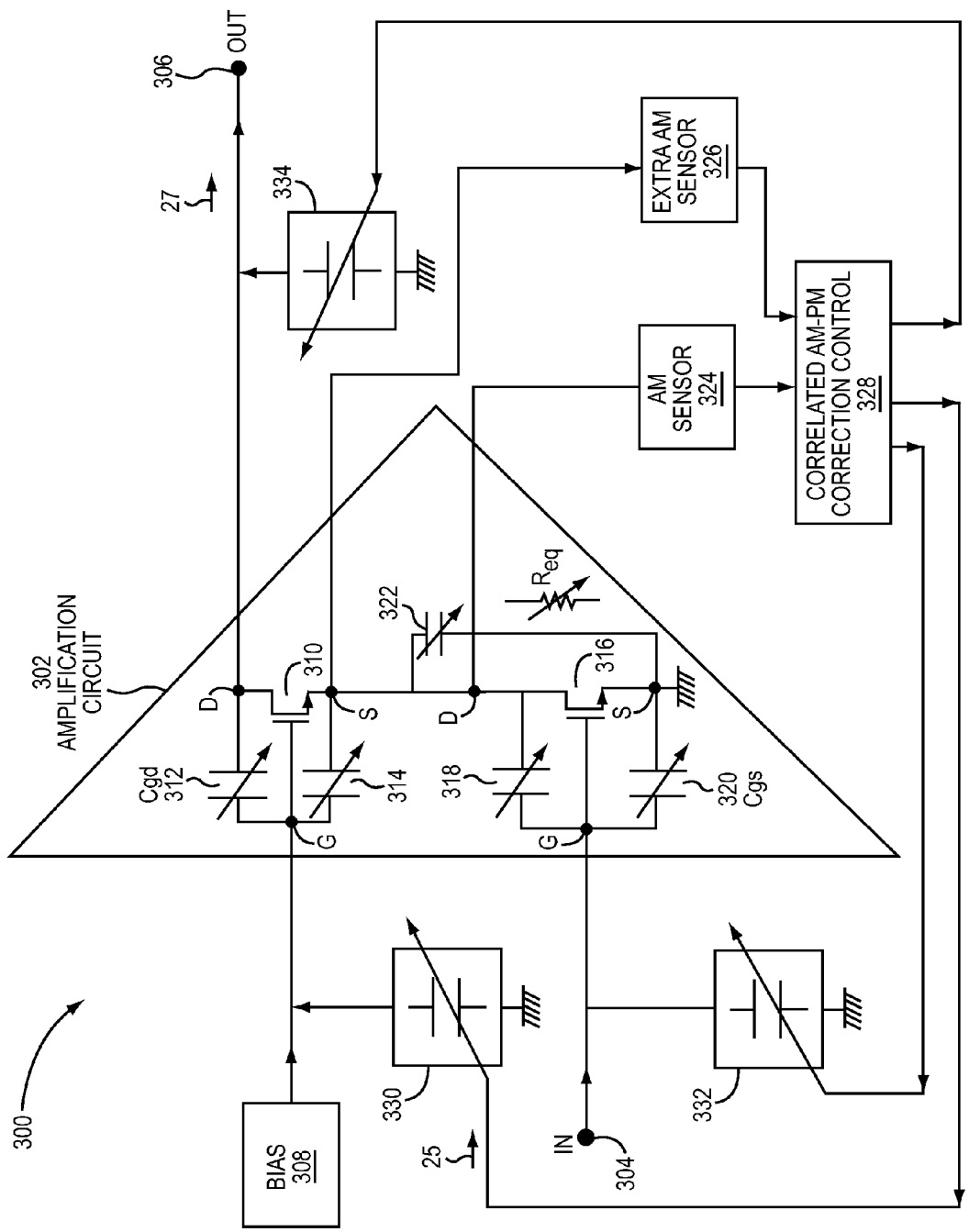
FIG. 11 illustrates a power amplifier including two stacked NMOS transistors, two AM sensors, a controller, and three phase shifting components (shifters).

FIG. 11 illustrates a power amplifier including two stacked NMOS transistors, two AM sensors, a controller, and three phase shifting components (shifters).

Specifically, FIG. 11 illustrates communication circuit 300 including amplification circuit 302, input node 304, output node 306, and bias circuit 308. Amplification circuit 302 includes transistor 310 and 316. Transistor 310 may be modeled as including two nonlinear capacitors 312 and 314. Transistor 316 may be modeled as including two nonlinear capacitors 318 and 320. Other nonlinear elements of amplification circuit 302 include equivalent resistance Req and capacitor 322. Other nonlinear capacitors may also be present.

Various correction circuits (or control loops) may be formed by various combinations of sensors 324 and 326; control circuit 328; and phase shifters 330, 332, and 334. For example, sensors 324, control circuit 328, and phase shifter 332 form a feedback loop from the drain of transistor 316 to the gate of transistor 316, similar to the feedback loop previously discussed in FIG. 8. Alternatively (or simultaneously), sensor 324, control circuit 328, and phase shifter 334 form a feed forward loop. One sensor may serve multiple phase shifters, or multiple sensors may serve a single phase shifter. Similarly, control circuit 328 may be removed, or may be implemented as multiple control circuits.

Phase shifter 334 has some drawbacks because it must be relatively large to interact with the high output power of amplification circuit 302. Phase shifter 334 may also undesirably interact with an antenna (not shown) attached to output node 306.

Additional transistors (not shown), may be stacked between transistors 310 and 316. See FIG. 9 for a generalized example.

Three of the non-linear elements of amplification circuit 302 are of particular interest: gate to source capacitance 320 (Cgs) of the bottom transistor 316, gate to drain capacitance 312 (Cgd) of the top transistor 310, and equivalent resistance Req. The nonlinearities of these three elements will be described in later figures. Other nonlinearities exist, and may be manipulated within the scope of this application.

Figure 12:
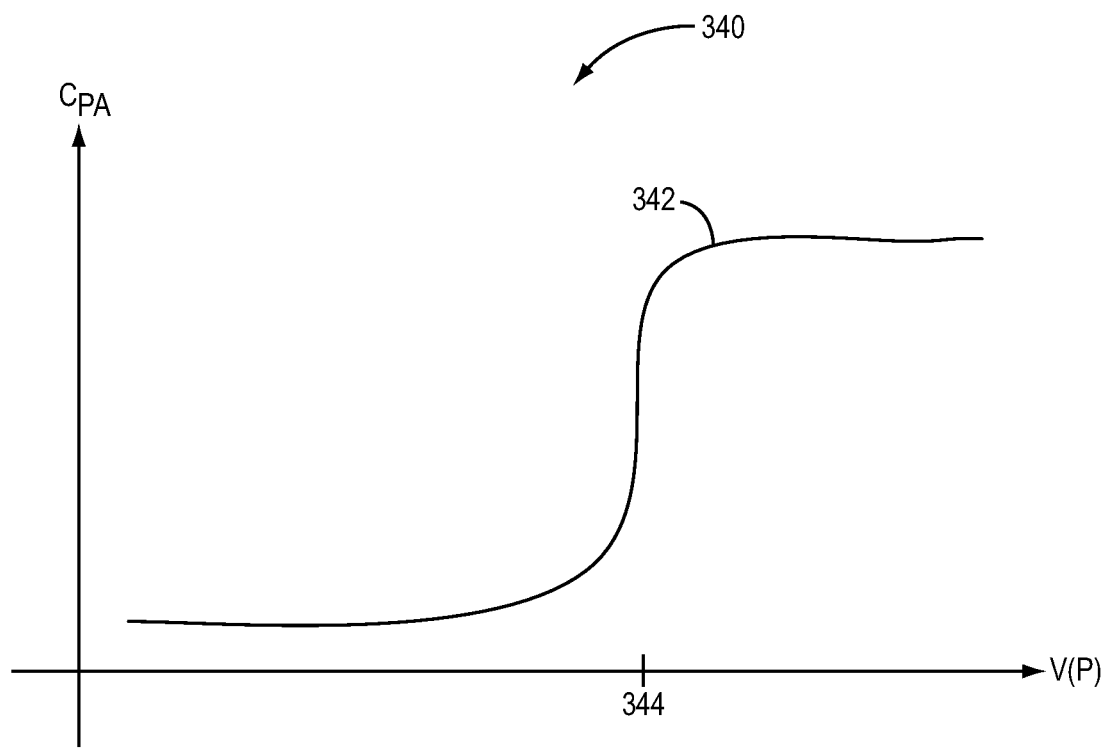
FIG. 12 illustrates a typical change in capacitance in a power amplifier due to nonlinear elements.

FIG. 12 illustrates graph 340 plotting a typical change in capacitance (CPA) as a function of power in amplification circuit 302 in due to nonlinear elements (such as Cgs). Curve 342 illustrates that capacitance CPA rises sharply (almost a step function) at voltage 344. This capacitance CPA is very sharply non-linear near voltage 344.

Figure 13:
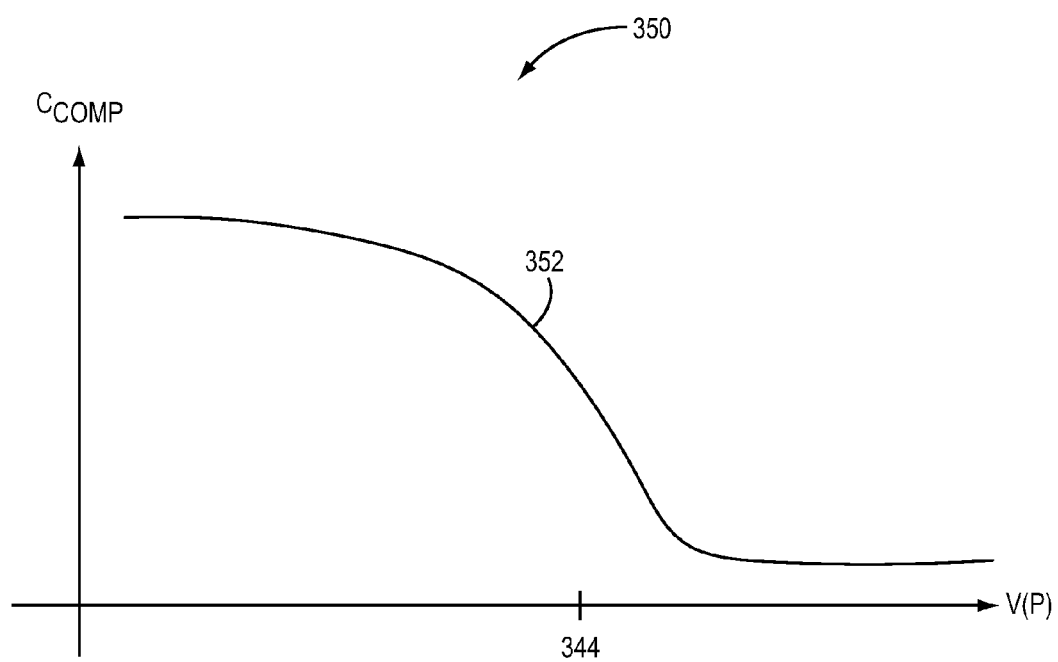
FIG. 13 illustrates a typical change in capacitance in controllable phase shifting component such as a varactor.

FIG. 13 illustrates graph 350 plotting a typical change in capacitance Ccomp in a controllable phase shifting component such as a varactor. For example, see phase shifter 332 in FIG. 11. This capacitance Ccomp is gently (or slowly) non-linear in the region near voltage (or power) 344.

Figure 14:
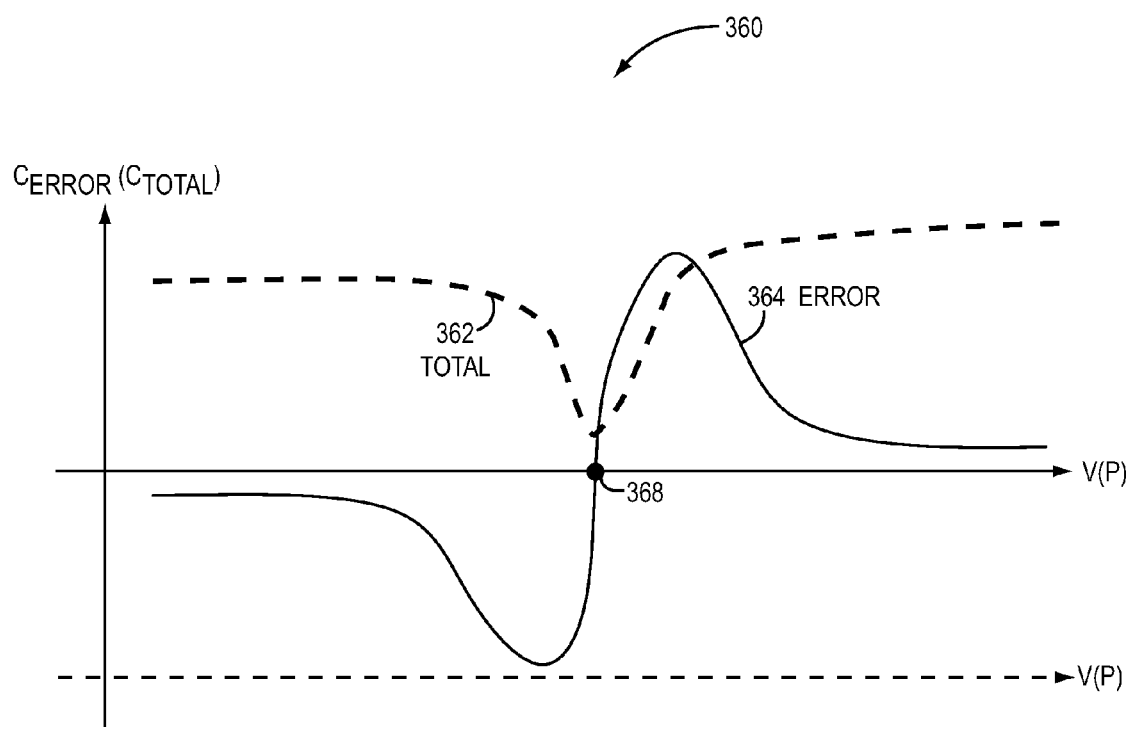
FIG. 14 illustrates the total capacitance of a communication circuit (such that includes nonlinear capacitances.

FIG. 14 illustrates graph 360 plotting the total capacitance 362 of a communication circuit (such as communication circuit 200 in FIG. 8) that includes nonlinear capacitances such as Cgs and Ccomp. The error (nonlinearity) caused by these nonlinear elements is plotted by solid line 364. Point 368 indicates where the error is zero.

Thus, even though CPA tends to increase with power and Ccomp tends to decrease with power, substantial errors (due to nonlinear total capacitance) still occur.

Figure 15:
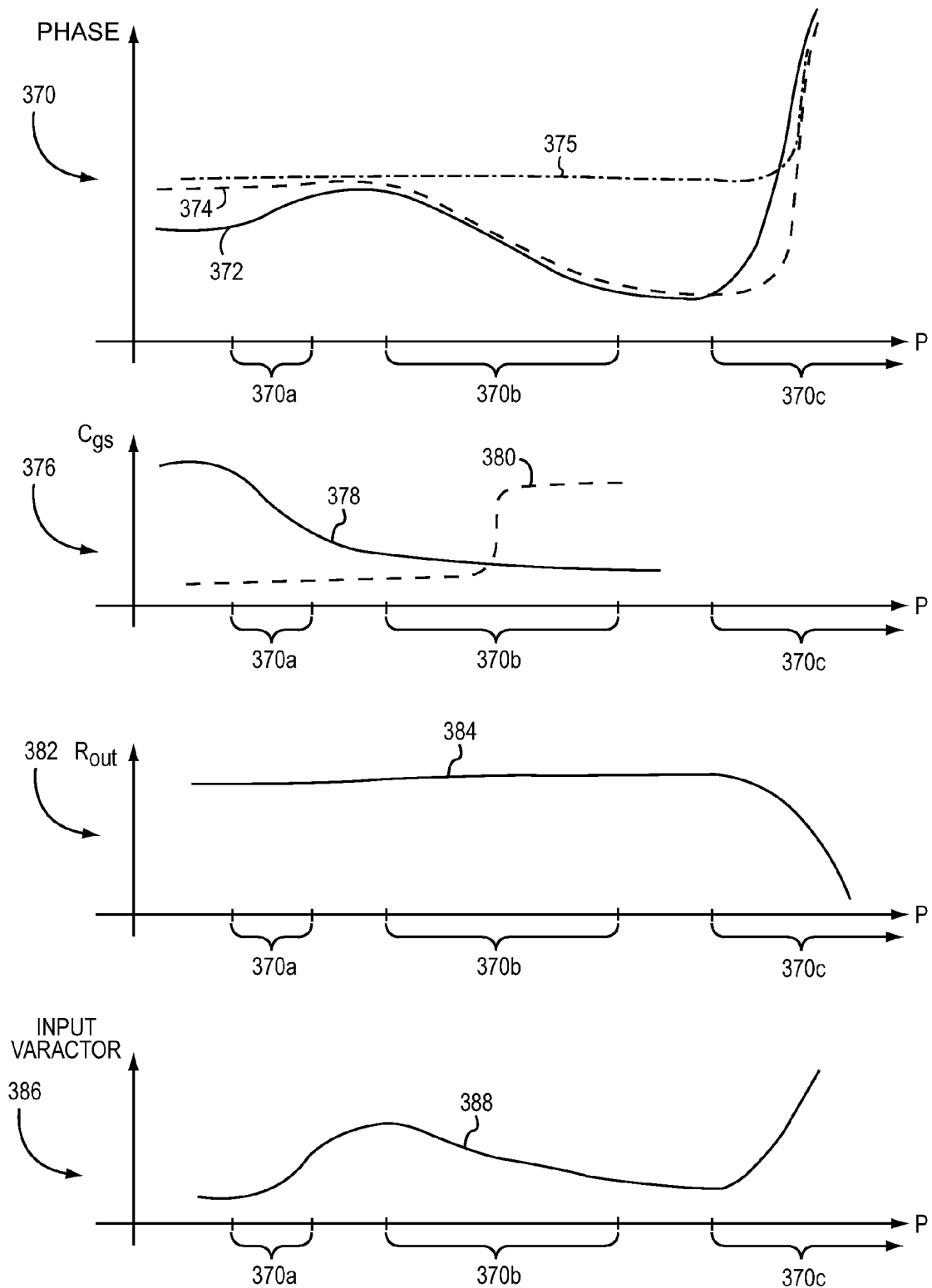
FIG. 15 illustrates phase distortion versus power for a communication circuit under various conditions.

FIG. 15 illustrates graph 370 plotting phase distortion versus power for a communication circuit under various conditions. As previously discussed, there are three nonlinear elements of particular interest: Cgs, Cgd, and Req (also known as Rout). Cgs is nonlinear in range 370a, Cgd is nonlinear in range 370b, and Req is nonlinear in range 370c.

Solid line 372 plots phase distortion caused by all three nonlinear elements, and may be described as the "native" or uncorrected phase distortion. Dashed line 374 corrects for Cgs and Req, but does not correct for Cgd. Finally, dashed/dotted line 375 corrects for all three nonlinear elements (Cgs, Cgd, and Req), and thus provides high linearity (constant phase distortion), but is still subject to clipping (a nonlinearity) at the very highest power shown.

Graph 376 plots capacitance as a function of power for Cgs using solid line 378, and for Cgd using dashed line 380.

Graph 382 plots equivalent resistance Req as a function of power using curve 384. As power increases at the right hand side of curve 384, Req starts to decrease gently due to early saturation, then decreases strongly due to strong saturation, and finally decreases very strongly due to clipping.

Graph 386 plots the capacitance of an input varactor (such as phase shifter 212 in FIG. 8) as a function of power using curve 388 needed to perform the phase distortion correction. As power increases, the capacitance increases then decreases and then increases again, yielding the complex curvature of curve 388.

Figure 16:
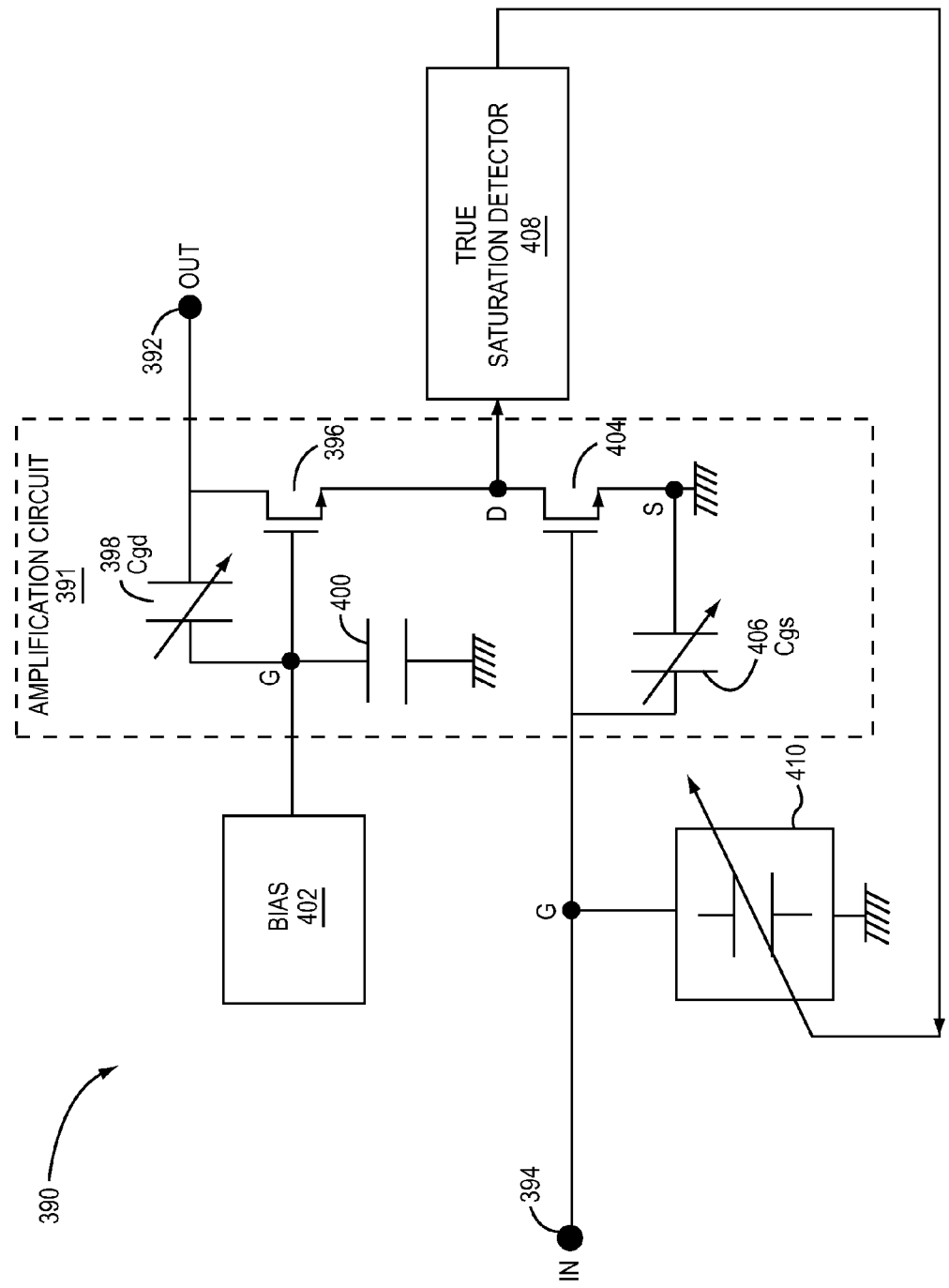
FIG. 16 illustrates a communication circuit including a true saturation detector.

FIG. 16 illustrates communication circuit 390 including amplification circuit 391, output node 392, input node 394, bias 402, sensor 408 (sensor 408 is a true saturation detector), and phase shifter 410.

Amplification circuit 391 includes transistor 396, capacitor 398, and capacitor 400, transistor 404, and capacitor 406.

Sensor 408 is a true saturation detector. A "true" saturation detector uses replica stages corresponding to the stacked transistors in order to emulate the stacked transistors and to measure an emulated saturation. See the provisional applications that are incorporated by reference by this application for additional discussion.

Sensor 408 and phase shifter 410 form a feedback correction circuit similar to correction circuit 203 in FIG. 8. Thus, true saturation is measured at the drain of transistor 404 or at a replica state that emulates the behavior of the output stage devices, and this measurement is used to correct phase distortion by controlling phase shifter 410.

Figure 17:
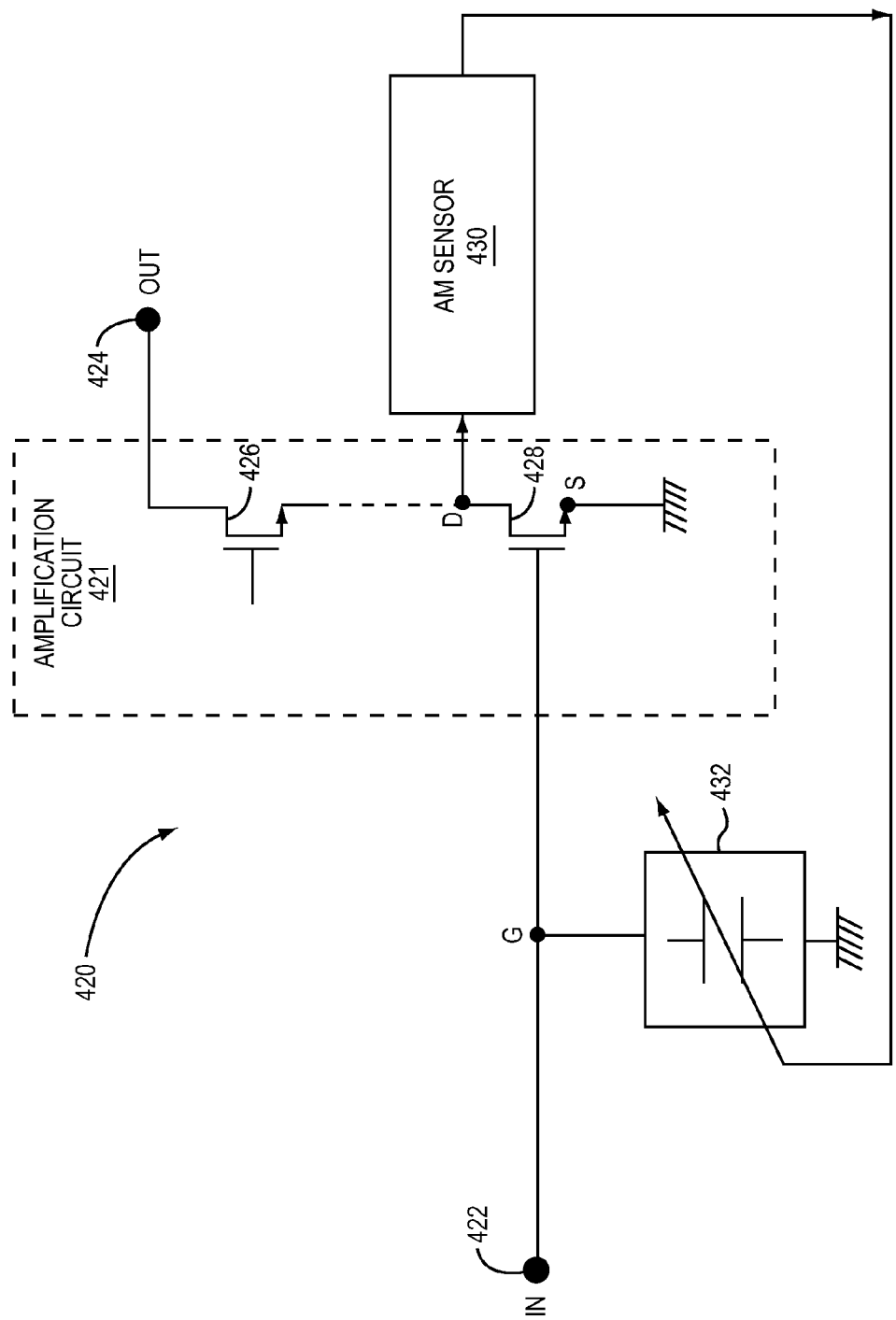
FIG. 17 illustrates a communication circuit including a feedback correction circuit with an amplitude sensor.

FIG. 17 illustrates communication circuit 420 including amplification circuit 421, input node 422, output node 424, sensor 430, and phase shifter 432. Amplification circuit 421 includes transistors 426 and 428.

Sensor 430 measures an amplitude at the drain of transistor 428 or of a replica stage, and controls phase shifter 432. Together, sensor 430 and phase shifter 432 for a feedback correction circuit similar to correction circuit 203 in FIG. 8. An optional control circuit (not shown) may be inserted between sensor 430 and phase shifter 432.

Figure 18:
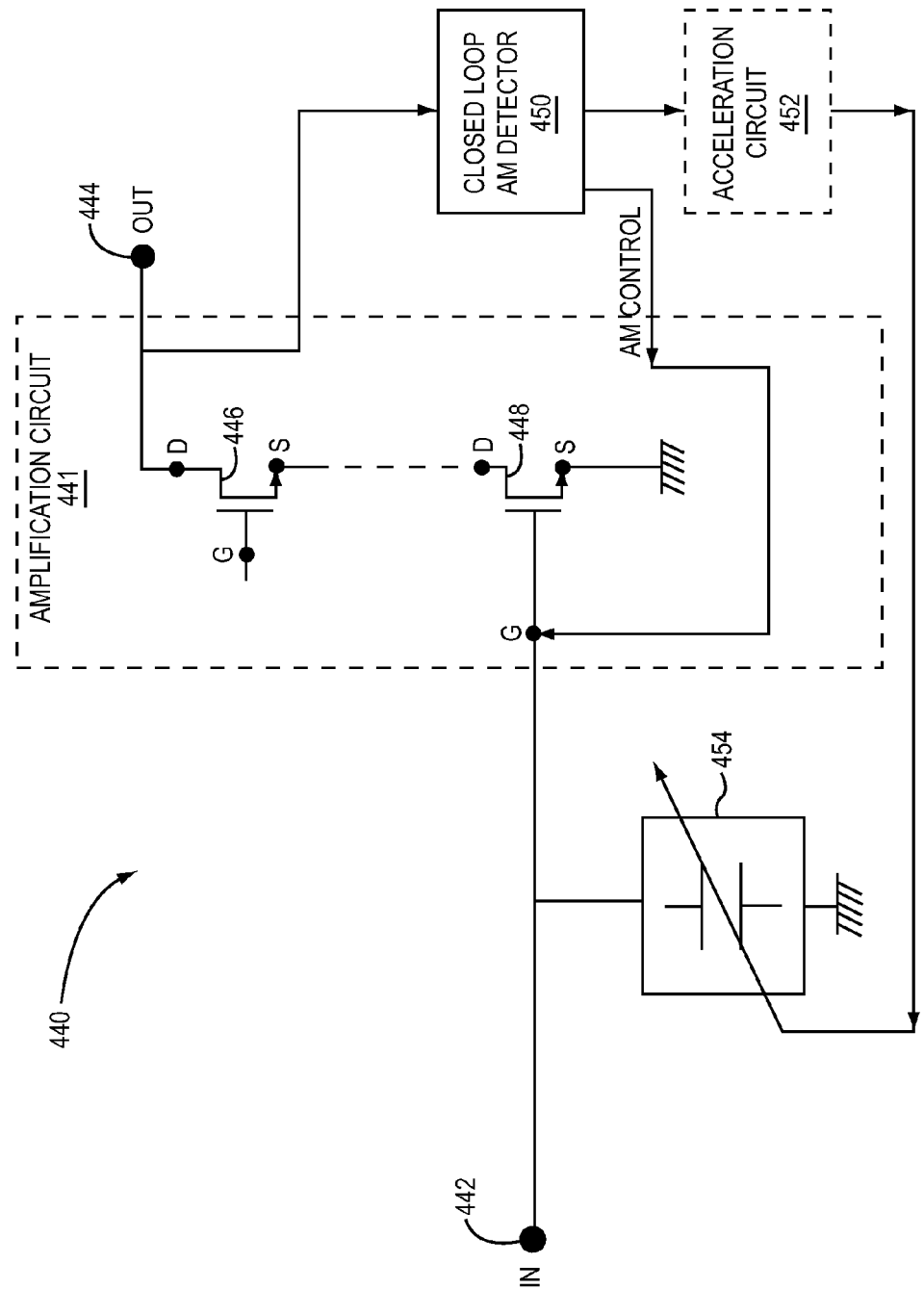
FIG. 18 illustrates a communication circuit including an amplitude feedback loop and an acceleration circuit.

FIG. 18 illustrates communication circuit 440 including amplification circuit 441, input node 442, output node 444, sensor 450 (sensor 450 is an amplitude detector used in a closed loop, not an amplitude distortion detector), acceleration circuit 452, and phase shifter 454. Amplification circuit 441 includes transistor 446 and transistor 448.

Sensor 450 measures an amplitude at the output of transistor 446 and then sends a control signal to the gate of transistor 448. Thus, sensor 450 is a "simple" and conventional feedback loop with respect to amplification circuit 441, because sensor 450 measures amplitude at the output of amplification circuit 441 and then modifies (or corrects) amplitude at the input of amplification circuit 441.

However, sensor 450 may also simultaneously serve as a sensor for a correction circuit similar to correction circuit 203. Specifically, sensor 450, acceleration circuit 452 (a type of control circuit), and phase shifter 454 form a correction circuit similar to correction circuit 203 in FIG. 8.

As previously discussed above in FIGS. 12-14, a compensating varactor such as phase shifter 454 responds relatively slowly to power increases (as shown in FIG. 13), relative to the sharp response of the capacitance of a power amplifier to power increases (as shown in FIG. 12). Thus, acceleration circuit 452 may, for example, amplify signals from sensor 450 such that phase shifter 454 more accurately linearizes communication circuit 440.

Figure 19:
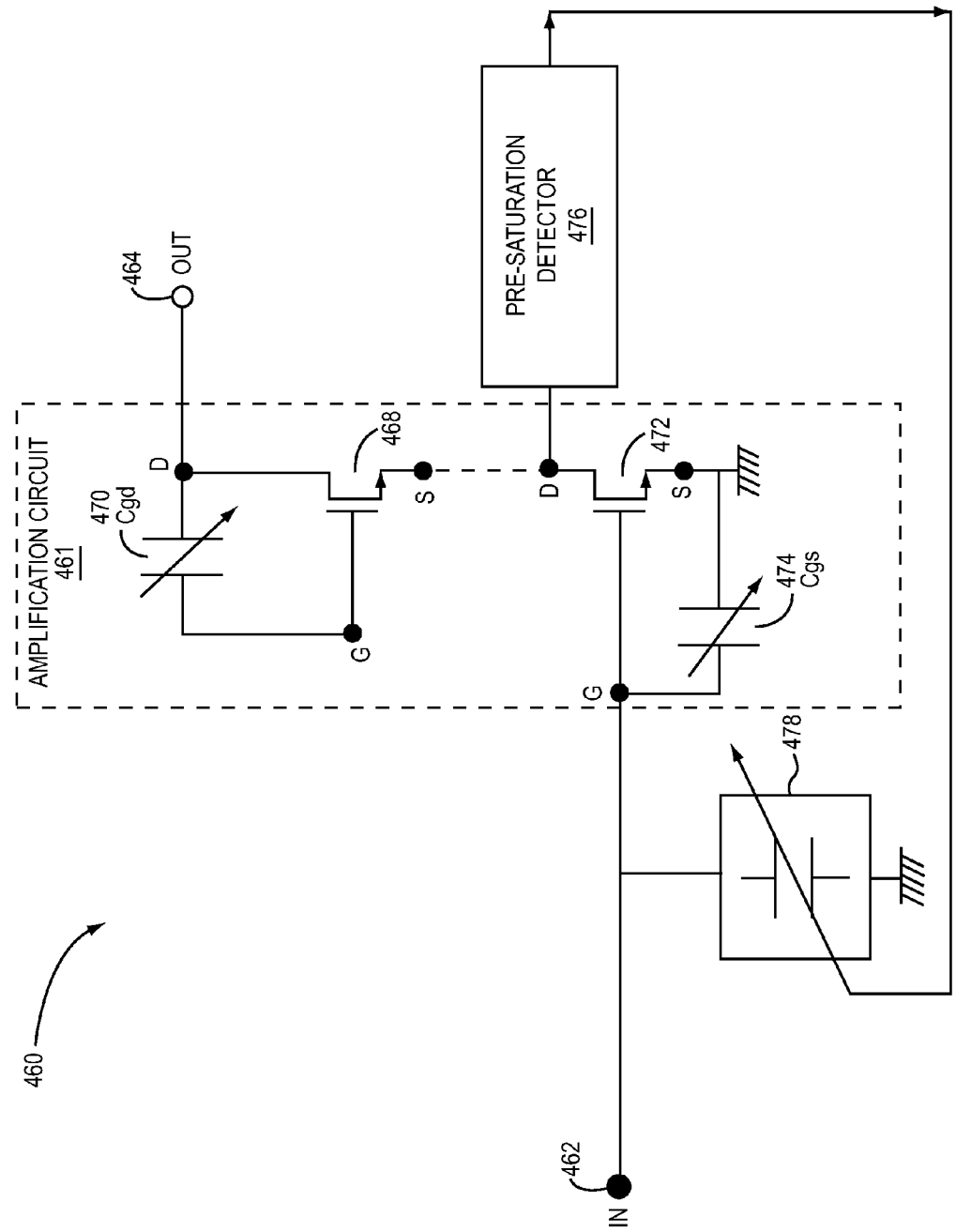
FIG. 19 illustrates a communication circuit including a pre-saturation detector.

FIG. 19 illustrates amplification circuit 461, input node 462, output node 464, sensor 476, and phase shifter 478. Amplification circuit 461 includes transistor 468, capacitor 470, transistor 472, and capacitor 474.

Sensor 476 is a pre-saturation sensor. A pre-saturation sensor is offset relative to a saturation detector such that the sensor sends a signal indicating/estimating that saturation is being approached. Alternatively, it sends a signal to the given offset from the point when the saturation of a given device happens; the given offset should may align with and thus predict the point when the saturation of another device (with no sensor) occurs.

Sensor 476 and phase shifter 478 form a correction circuit similar to correction circuit 203 in FIG. 8, except that sensor 476 is a pre-saturation sensor.

FIG. 20 illustrates a graph 492 with curve 496 indicating a control voltage Vth of control signal 216 sent by sensor 204 to phase shifter 212 in FIG. 8. Referring to FIG. 8, sensor 204 is an amplitude sensor. The increase of curve 496 at high power is due to nonlinearity of Req in amplification circuit 201.

FIG. 21 illustrates communication circuit 500 including amplification circuit 501, input node 502, output node 504, bias circuit 512, sensor 516, sensor 518, and phase shifter 520. Amplification circuit 501 includes transistor 506, capacitor 508, capacitor 510, and transistor 514.

Sensor 518 is a direct saturation detector measuring an amplitude of the drain of transistor 506 relative to the source of transistor 506. In other words, sensor 518 floats relative to transistor 506, and directly measures amplitude saturation at output node 504. Sensor 518 sends a signal to phase shifter 520.

Sensor 516 is an indirect saturation detector that predicts or estimates (based on measurements at the drain of transistor 514) when saturation occurs in transistor 506, and then sends an appropriate signal to phase shifter 520.

A direct saturation detector (such as sensor 518) is more accurate than indirect saturation detector (such as sensor 516). However, sensor 518 is relatively expensive because it is a floating sensor (floats relative to ground, similar to transistor 506), and because it must measure relatively high power signals in transistor 506 (relative to low power signals in transistor 514).

Thus, either sensor 516 or sensor 518 may be used, or both may be used. Further, one or more control circuits (not shown) may be inserted between phase shifter 520 and the sensors 516 and 518.

FIG. 22 illustrates communication circuit 530 including amplification circuit 531, input node 532, output node 534, bias circuit 540, sensor 544 (sensor 544 is an indirect saturation detector), phase shifter 546, and sensor 548 (sensor 548 is a direct saturation detector). Amplification circuit 531 includes transistor 542, transistor 536, and capacitor 538.

Communication circuit 530 of FIG. 22 is similar to communication circuit of FIG. 21, except that the phase shifter has been moved from the output node to the gate of the top transistor. Specifically, in FIG. 22 phase shifter 546 is coupled to the gate of transistor 536.

Relative to FIG. 22, the configuration of FIG. 21 has the advantage of greatly reducing any effects on the phase shifter from the large output signal (i.e. output voltage). The signal level at the gate of device 536 is much lower than the signal at the drain (output) of resistor 536 and, as such, the phase shifter 546 is much more effective than the phase shifter 520 on FIG. 21.

FIG. 23 graphs a gate-drain capacitance as a function of power, and other variables as a function of power.

Graph 560 plots the capacitance of capacitor 312 (Cgd) as a function of power using curve 562.

Graph 564 plots the capacitance of phase shifter 324 (also known as an output varactor or as a cascade varactor) as a function of power using curve 566.

Graphs 568 plots the phase of amplified RF signal 27 as a function of power using curve 570 for an uncorrected phase of amplified RF signal 27, and using dashed straight line 572 for a corrected phase of amplified RF signal 27 (using one of the correction circuits of the above figures).

FIG. 24 illustrates communication circuit 570 including amplification circuit 571, input node 573, output node 571, sensor 578 (sensor 578 is a floating true saturation detector), sensor 584 (sensor 584 is a true saturation detector that is not floating), phase shifter 580, phase shifter 582, and phase shifter 586. Amplification circuit 571 includes transistor 572, transistor 574, capacitor 576, and capacitor 577.

Sensor 584 is a true saturation detector that feeds back to phase shifter 586 to form a feedback correction circuit. An optional control circuit (not shown) may be located between sensor 584 and phase shifter 586.

Sensor 578 is a floating true saturation detector that measures or detects the saturation of transistor 572 and then controls phase shifter 580 and/or phase shifter 582. One or more optional control circuits (not shown) may be located between sensor 578 and phase shifter 580 (and/or phase shifter 582.)

FIG. 25 illustrates communication circuit 590 including amplification circuit 591, sensor 600, phase shifter 602, sensor 604, sensor 606, phase shifter 608, and phase shifter 610. Amplification circuit 591 includes transistor 592, transistor 596, capacitor 598, and equivalent resistor Req.

The drain of transistor 596 (the bottom transistor in a stack) is a convenient measurement point for sensors 600, 604, and 606. Sensor 600 is a true saturation detector coupled to phase shifter 602.

Sensor 604 is a pre-saturation detector coupled to phase shifter 602. Alternatively, sensor 604 may be coupled to an additional phase shifter (not shown) that is similar to phase shifter 602.

Sensor 606 is a pre-saturation sensor coupled to phase shifter 608 that is coupled to the gate of transistor 592. Alternatively (or additionally), sensor 606 may be coupled to phase shifter 610 that is coupled to the drain of transistor 592.

As previously discussed, optional control circuits (not shown) may be inserted between any combinations of sensors and phase shifters.

In general, large distortion in an amplifier is created when devices leave the normal operating regime. Both amplitude (gain) and phase distortion are usually generated when a key device of the amplifier goes from normal operation to a saturation regime of operation where its behavior changes significantly.

Therefore, a saturation detector can be a good detector/indicator of when large distortions happen. Saturation detectors are often built as amplitude distortion detectors. However, other types of saturation detectors exist which look at certain voltages and currents and compare them with given thresholds.

Amplitude distortion detectors usually compare the signal of the sensed device (or of a replica device that emulates the behavior of the sensed device) against a signal coming from a device that is guaranteed not to saturate (a reference signal). When the difference between the two signals becomes significant (e.g., crosses a given threshold), then the sensed device is considered to have entered the saturation regime.

Those skilled in the art will recognize improvements and modifications to the preferred embodiments of the present disclosure. All such improvements and modifications are considered within the scope of the concepts disclosed herein and the claims that follow.

What is claimed is:

1. Circuitry comprising:
   amplification circuitry comprising a first transistor and a second transistor stacked with the first transistor, wherein the first transistor includes a gate, a drain, and a source, and the amplification circuitry is configured to receive an input signal at an input node and provide an amplified output signal at an output node;
   an amplitude distortion sensor coupled to the drain of the first transistor and configured to measure amplitude distortion at the drain of the first transistor to provide an amplitude distortion measurement signal;
   a phase shifter coupled to the gate of the first transistor and configured to adjust a phase of the input signal based on a phase correction signal; and
   control circuitry coupled between the amplitude distortion sensor and the phase shifter and configured to receive the amplitude distortion measurement signal and provide the phase correction signal based on the amplitude distortion measurement signal.

2. The circuitry of claim 1, further comprising:
   an intermediate amplitude distortion sensor coupled to a first intermediate node of the amplification circuitry and configured to measure amplitude distortion in a first intermediate signal to provide an intermediate amplitude distortion measurement signal; and an intermediate phase shifter coupled to a second intermediate node of the amplification circuitry and configured to adjust a phase of a second intermediate signal based on an intermediate phase correction signal, wherein the control circuitry is coupled between the intermediate amplitude distortion sensor and the intermediate phase shifter and configured to receive the intermediate amplitude distortion measurement signal and provide the intermediate phase correction signal.

3. The circuitry of claim 2, wherein:
the amplitude distortion sensor and the phase shifter form at least a portion of a first feedback loop; and
the intermediate amplitude distortion sensor and the intermediate phase shifter form at least a portion of a second feedback loop.

4. The circuitry of claim 2, wherein:
the amplitude distortion sensor and the phase shifter form at least a portion of a first feedback loop; and
the intermediate amplitude distortion sensor and the intermediate phase shifter form at least a portion of a first feed forward loop.

5. The circuitry of claim 2, wherein:
the amplitude distortion sensor and the phase shifter form at least a portion of a first feed forward loop; and
the intermediate amplitude distortion sensor and the intermediate phase shifter form at least a portion of a second feed forward loop.

6. Circuitry comprising:
amplification circuitry configured to receive an input signal at an input node and provide an amplified output signal at an output node, the amplification circuitry comprising:
a first transistor having a gate, a drain, and a source; and
a second transistor having a gate, a drain, and a source coupled to the drain of the first transistor; and
an amplitude distortion sensor coupled to the output node of the amplification circuitry and configured to measure amplitude distortion in the amplified output signal to provide an amplitude distortion measurement signal,
a phase shifter coupled between the input node and the amplitude distortion sensor and configured to adjust a phase of the input signal based on the amplitude distortion measurement signal.

7. The circuitry of claim 6, wherein:
the amplitude distortion sensor is coupled to the drain of the first transistor; and
the phase shifter is coupled to the gate of the first transistor.

8. The circuitry of claim 7, further comprising:
an intermediate phase shifter coupled to the gate of the second transistor.

9. The circuitry of claim 8, further comprising:
an intermediate amplitude distortion sensor coupled to the source of the second transistor.

10. The circuitry of claim 9, further comprising:
an additional intermediate phase shifter coupled to the drain of the second transistor.

11. The circuitry of claim 10, wherein the amplitude distortion sensor is a true transconductance saturation detector.

* * * * *